(12) United States Patent
Okabe et al.

(10) Patent No.: US 12,356,815 B2
(45) Date of Patent: Jul. 8, 2025

(54) DISPLAY DEVICE AND METHOD FOR MANUFACTURING DISPLAY DEVICE

(71) Applicant: SHARP KABUSHIKI KAISHA, Sakai (JP)

(72) Inventors: Tohru Okabe, Sakai (JP); Shoji Okazaki, Sakai (JP); Shinsuke Saida, Sakai (JP); Shinji Ichikawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 447 days.

(21) Appl. No.: 18/013,534

(22) PCT Filed: Jul. 1, 2020

(86) PCT No.: PCT/JP2020/025746
§ 371 (c)(1),
(2) Date: Dec. 28, 2022

(87) PCT Pub. No.: WO2022/003845
PCT Pub. Date: Jan. 6, 2022

(65) Prior Publication Data
US 2023/0292561 A1    Sep. 14, 2023

(51) Int. Cl.
*H10K 59/131*     (2023.01)
*H10K 59/12*      (2023.01)
*H10K 102/00*     (2023.01)

(52) U.S. Cl.
CPC ....... *H10K 59/131* (2023.02); *H10K 59/1201* (2023.02); *H10K 2102/311* (2023.02)

(58) Field of Classification Search
CPC .................. H10K 59/131; H10K 59/1201
See application file for complete search history.

(56) References Cited

U.S. PATENT DOCUMENTS

| 2016/0172427 A1 | 6/2016 | Lee et al. |
| 2016/0268542 A1 | 9/2016 | Suzuki |
| 2020/0050055 A1 | 2/2020 | Higano et al. |
| 2021/0165527 A1* | 6/2021 | Kim ..................... H10K 59/124 |

FOREIGN PATENT DOCUMENTS

| JP | 2016170266 A | 9/2016 |
| JP | 2018124503 A | 8/2018 |
| JP | 2020027190 A | 2/2020 |

* cited by examiner

*Primary Examiner* — Douglas M Menz
(74) *Attorney, Agent, or Firm* — ScienBiziP, P.C.

(57) ABSTRACT

A display device includes a display region of an image, a terminal region provided with a plurality of terminals, and a bending region being a region between the display region and the terminal region and being bendable, the bending region includes a first resin layer, a plurality of relay wiring lines provided on the first resin layer and provided between the display region and the terminal region, and a second resin layer provided on the first resin layer and covering the plurality of relay wiring lines, and the first resin layer and the second resin layer in the bending region are provided with a plurality of slits having a depth from a surface of the second resin layer to the first resin layer at outer sides than the relay wiring lines provided at both ends among the plurality of relay wiring lines in a plan view.

12 Claims, 15 Drawing Sheets

DISPLAY DEVICE AND METHOD FOR MANUFACTURING DISPLAY DEVICE

TECHNICAL FIELD

The disclosure relates to a display device and a manufacturing method of the display device.

BACKGROUND ART

PTL 1 discloses a display device that is bent near an end portion thereof.

CITATION LIST

Patent Literature

PTL 1: JP 2016-170266 A

SUMMARY

Technical Problem

A lead-out wiring line configured to electrically connect a display region and a terminal provided at an end portion of a frame region is provided in a bending region of the display device. However, when the display device is cut to a desired size, a crack may be generated in a cut surface of the bending region, and the lead-out wiring line provided in the bending region may be disconnected. An aspect of the disclosure is to obtain a display device in which the wiring line is difficult to be disconnected even when the crack is generated in the bending region, and a manufacturing method of the display device.

Solution to Problem

A display device according to an aspect of the disclosure includes a display region of an image, a terminal region provided with a plurality of terminals, and a bending region being a region between the display region and the terminal region and being bendable, the bending region includes a first resin layer, a plurality of relay wiring lines provided on the first resin layer and provided between the display region and the terminal region, and a second resin layer provided on the first resin layer and covering the plurality of relay wiring lines, and the first resin layer and the second resin layer in the bending region are formed with a plurality of slits having a depth from a surface of the second resin layer to the first resin layer at outer sides than the relay wiring lines provided at both ends among the plurality of relay wiring lines in a plan view.

A manufacturing method of a display device according to an aspect of the disclosure, the display device including a display region of an image, a terminal region provided with a plurality of terminals, and a bending region being a region between the display region and the terminal region and being bendable, the manufacturing method including forming the bending region, the forming the bending region includes forming a first resin layer, forming a plurality of relay wiring lines between the display region and the terminal region on the first resin layer, and forming a second resin layer covering the plurality of relay wiring lines on the first resin layer, and the forming the second resin layer includes forming a plurality of slits having a depth from a surface of the second resin layer to the first resin layer in the first resin layer and the second resin layer at outer sides than the relay wiring lines provided at both ends among the plurality of relay wiring lines in a plan view.

Advantageous Effects of Disclosure

According to one aspect of the disclosure, the display device in which a wiring line is difficult to be disconnected even when a crack is generated in the bending region and the manufacturing method of the display device can be provided.

DESCRIPTION OF EMBODIMENTS

First Embodiment

A first embodiment of the disclosure will be described below. Note that in the following, "the same layer" means being formed of the same material in the same step.

Figure 1:
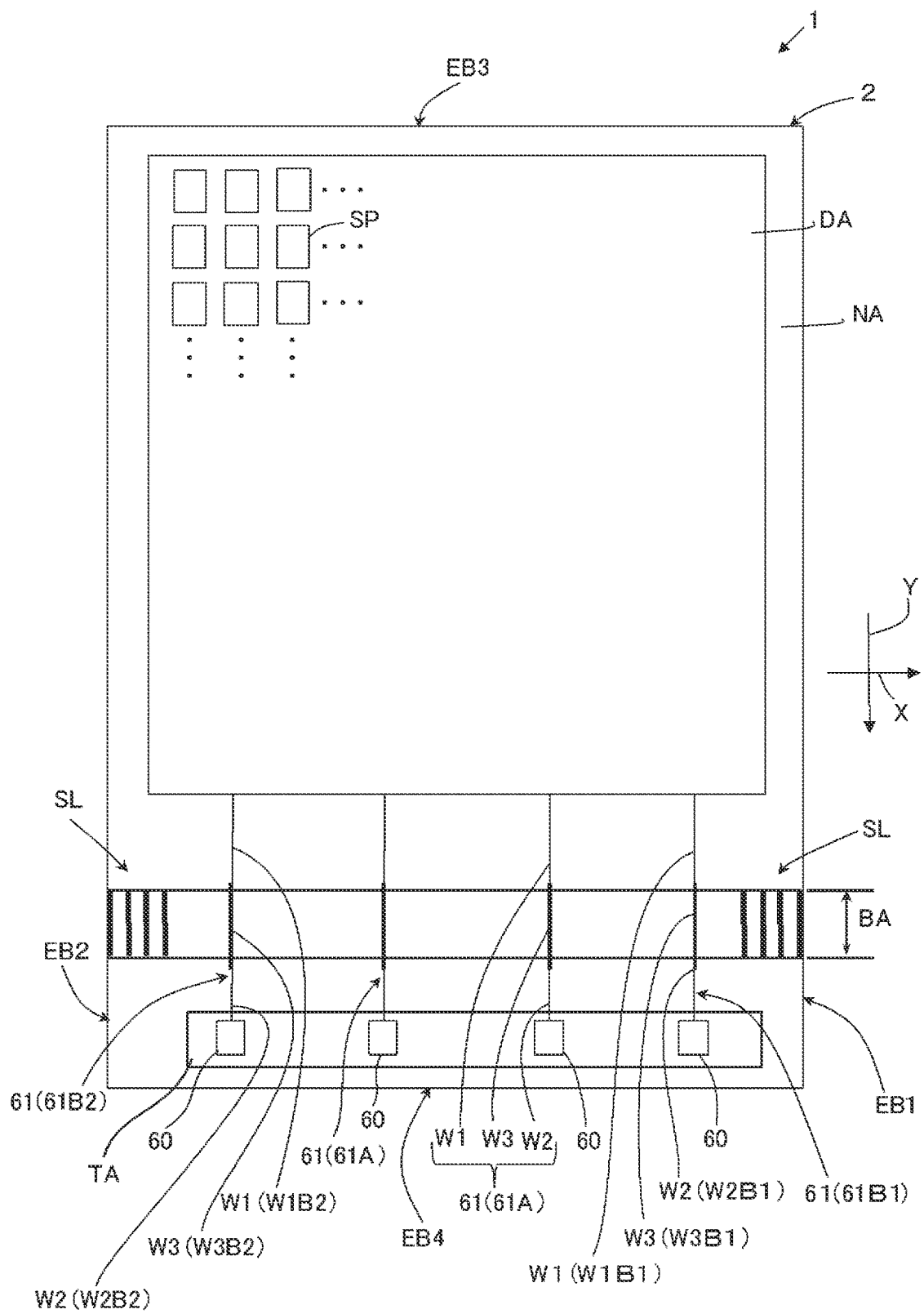
FIG. 1 is a plan view schematically illustrating a display panel included in a display device according to a first embodiment.

FIG. 1 is a plan view schematically illustrating a display panel 2 included in a display device 1 according to the first embodiment. As illustrated in FIG. 1, the display device 1 according to the present embodiment includes the display panel 2.

The display panel 2 includes a display region DA of an image, and a frame region (non-display region) NA having a frame-like shape surrounding the periphery of the display region DA. Further, the display panel 2 includes a terminal region TA provided in the frame region NA, a plurality of lead-out wiring lines 61, and a bending region BA. In addition, a plurality of slits SL are formed in the bending region BA.

The display panel 2 is surrounded by, for example, four end portions EB1, EB2, EB3, and EB4, and has a square shape in a plan view. In the plan view, the end portion EB1 and the end portion EB2 are long sides opposed to each other, and the end portion EB3 and end portion EB4 are short sides opposed to each other. Note that a planar shape of the display panel 2 is not limited to a square, and may have another shape. The display panel 2 is formed so as to have a desired size by cutting the end portions EB1, EB2, EB3, and EB4 by using a laser or the like in a singulation step after being formed as a panel having a size larger than that of the display panel 2, for example, as will be described later.

Note that in the present embodiment, a direction from the display region DA to the terminal region TA (a direction in which each of the end portions EB1 and EB2 extends, a longitudinal direction from the top toward the bottom of the page in FIG. 1) is defined as a Y direction (first direction), and a direction in which each of the end portions EB3 and EB4 extends (a lateral direction from the left toward the right of the page in FIG. 1) is defined as an X direction (second direction). The Y direction and the X direction are directions orthogonal to each other.

In the display region DA, a plurality of subpixels SP are disposed in a matrix shape. The plurality of subpixels SP include, for example, a red subpixel that emits red light, a green subpixel that emits green light, a blue subpixel that emits blue light, and the like.

The terminal region TA is a region where a plurality of terminals 60 are provided side by side. The terminal region TA is positioned near one end portion EB4 of the display panel 2, and extends along the end portion EB4, for example. The plurality of terminals 60 provided in the terminal region TA are electrically connected to a plurality of terminals, a plurality of wiring lines, or the like, of a circuit provided outside the display panel 2 or the like, which will be described below. The plurality of terminals 60 are positioned, for example, near one end portion EB4 of the display panel 2, and are aligned along the end portion EB4.

The bending region BA is a region between the display region DA and the terminal region TA, and is a region that is bendable. For example, the bending region BA continuously extends so as to connect both the end portions EB1 and EB2 to each other. The bending region BA is provided so as to extend in the X direction. In other words, a longitudinal direction of the bending region BA is the X direction, and a short-hand direction orthogonal to the longitudinal direction is the Y direction.

For example, the display panel 2 includes a flexible base material having flexibility, so that the bending region BA can be bent, for example, by 180°. Note that the display panel 2 does not need to include a flexible base material having flexibility on the entire surface, and may include a flexible base material having flexibility at least in the bending region BA, so that the bending region BA may be bendable.

The plurality of lead-out wiring lines 61 are individually provided between the display region DA and the terminal region TA. The plurality of lead-out wiring lines 61 individually extend from the display region DA to the frame region NA, pass through the bending region BA, and are electrically connected to the plurality of terminals 60 in the terminal region TA. Thus, input signals input to the plurality of terminals 60 from an external circuit of the display panel 2 through the plurality of lead-out wiring lines 61 can be supplied to the display region DA, and output signals output from the display region DA can be supplied to the plurality of terminals 60.

The plurality of lead-out wiring lines 61 extend in the Y direction and are disposed side by side in the X direction. Each of the plurality of lead-out wiring lines 61 includes a first lead-out wiring line W1, a second lead-out wiring line W2, and a relay wiring line W3.

Each of a plurality of first lead-out wiring lines W1 is electrically connected at one end portion to a wiring line, a thin film transistor, or the like provided in the display region DA, and extends in a direction from the display region DA to the bending region BA, and the other end portion is provided in the frame region NA near the bending region BA. Each of a plurality of second lead-out wiring lines W2 is electrically connected at one end portion thereof to the terminal 60, and extends in a direction from the terminal 60 to the bending region BA, and the other end portion thereof is provided in the frame region NA near the bending region BA. The plurality of relay wiring lines W3 are provided between the display region DA and the terminal region TA. Each of the plurality of relay wiring lines W3 is electrically connected at one end portion thereof to the other end portion of the first lead-out wiring line W1, and extends so as to pass through the bending region BA, and the other end portion thereof is electrically connected to the other end portion of the second lead-out wiring line W2. Due to this, the relay wiring line W3 electrically connects the first lead-out wiring line W1 and the second lead-out wiring line W2. Each of the plurality of relay wiring lines W3 extends so as to intersect the longitudinal direction (X direction) of the bending region BA.

Note that, among the plurality of lead-out wiring lines 61 aligned in the Y direction, the lead-out wiring lines 61 at both end portions may be referred to as lead-out wiring lines 61B1 and 61B2. Among the lead-out wiring lines 61 at both end portions, the lead-out wiring line closer to the end portion EB1 is referred to as the lead-out wiring line 61B1, and the lead-out wiring line closer to the end portion EB2 is referred to as the lead-out wiring line 61B2.

Additionally, among the wiring lines included in the lead-out wiring line 61B1, the first lead-out wiring line W1 may be referred to as a first lead-out wiring line W1B1, the second lead-out wiring line W2 may be referred to as a second lead-out wiring line W2B1, and the relay wiring line W3 may be referred to as a relay wiring line W3B1. Additionally, among the wiring lines included in the lead-out wiring line 61B2, the first lead-out wiring line W1 may be referred to as a first lead-out wiring line W1B1, the second lead-out wiring line W2 may be referred to as a second lead-out wiring line W2B2, and the relay wiring line W3 may be referred to as a relay wiring line W3B2.

The plurality of slits SL are formed at outer sides than the lead-out wiring lines 61B1 and 61B2 at both ends in the bending region BA. That is, the plurality of slits SL are formed in a region between the lead-out wiring line 61B1 and the end portion EB1 that is closer to the lead-out wiring line 61B1 among the end portions EB1 to EB4 in the bending region BA. Additionally, the plurality of slits SL are formed in a region between the lead-out wiring line 61B2 and the end portion EB2 that is closer to the lead wiring line 61B2 among the end portions EB1 to EB4 in the bending region BA. The plurality of slits SL suppress disconnection of the lead-out wiring lines 61B1 and 61B2 in a case where cracks generated when the end portions EB1 and EB2 are cut and reach the lead-out wiring lines 61B1 and 61B2. Details of the plurality of slits SL will be described later.

Figure 2:
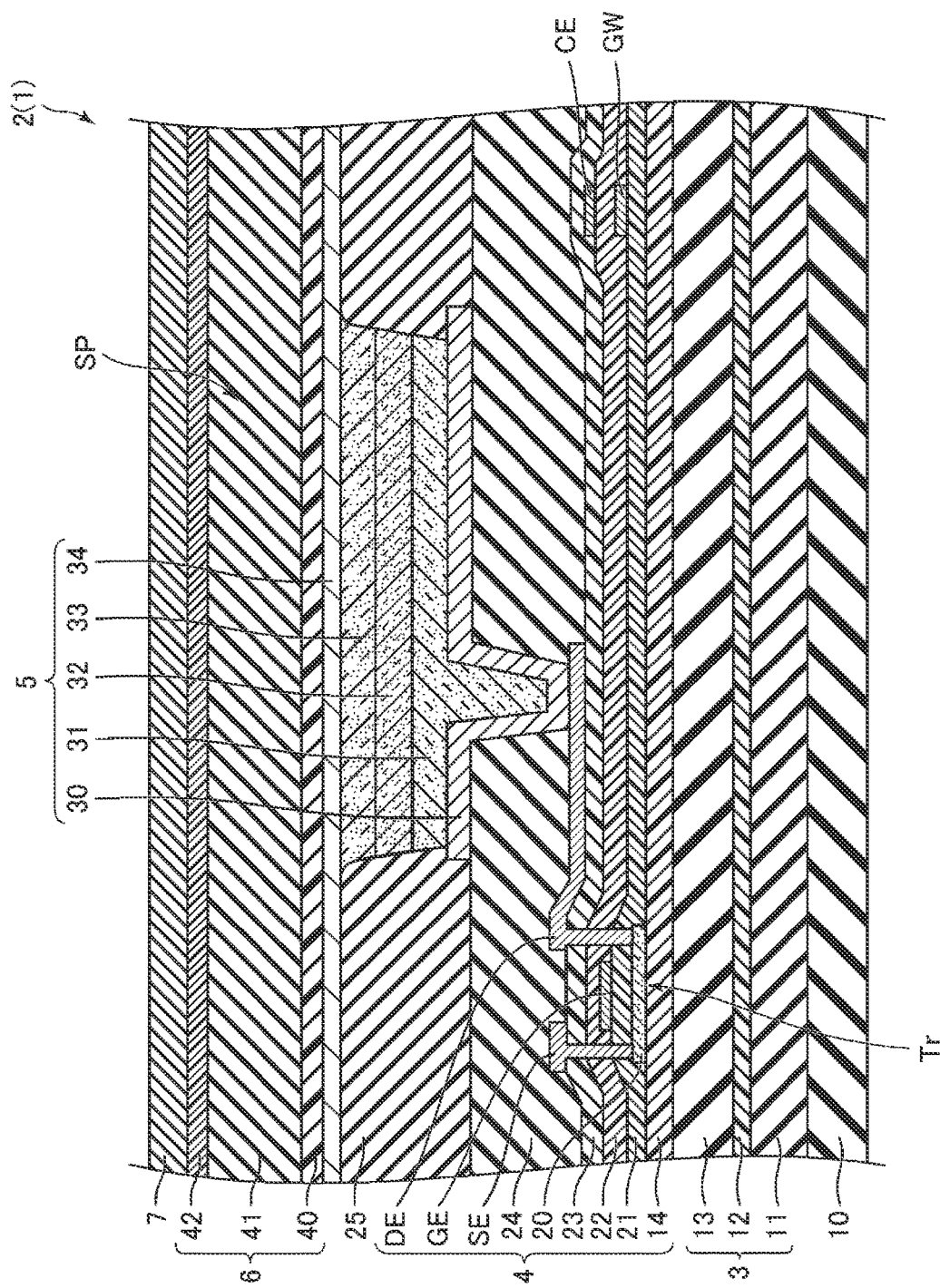
FIG. 2 is a cross-sectional view of the display panel in the display device according to the first embodiment near a subpixel.

FIG. 2 is a cross-sectional view of the display panel 2 of the display device 1 according to the first embodiment near a subpixel SP. The display panel 2 includes, for example, a second film 10, a base material 3 provided on the second film 10, a base coat layer 14 provided on the base material 3, a thin film transistor (TFT) layer 4 provided on the base coat layer 14, a plurality of light-emitting elements 5 and a bank 25 that are provided on the TFT layer 4, a sealing layer 6 provided on the plurality of light-emitting elements 5 and the bank 25, and a first film 7 provided on the sealing layer 6.

The second film 10 protects the back surface (lower surface) of the display panel 2 and has flexibility. The second film 10 is configured by containing a resin material such as polyethylene terephthalate (PET), for example.

The base material 3 is continuously provided over the entire surface of the display panel 2, and is a member that serves as a base in the display panel 2. The base material 3 has flexibility. In the present embodiment, the base material 3 is a multilayer structure including a first base resin layer 11 provided on the second film 10, a buffer layer 12 provided on the first base resin layer 11, and a second base resin layer 13 provided on the buffer layer 12.

Each of the first base resin layer 11 and the second base resin layer 13 is configured by containing a resin material such as polyimide, for example. For example, the buffer layer 12 is, for example, an inorganic insulating layer configured by containing an inorganic insulating material such as silicon oxide, silicon nitride, or silicon oxynitride.

The first base resin layer 11 and the second base resin layer 13 are members to be provided over the entire surface of the display panel 2 as a base, for example, and do not need to be patterned. That is, the first base resin layer 11 and the second base resin layer 13 do not need to contain a photosensitive material. Thus, the first base resin layer 11 and the second base resin layer 13 have high thermal resistance, compared to a resin layer containing a photosensitive material, and can be cured at a high temperature. As a result, the first base resin layer 11 and the second base resin layer 13 are less likely to generate cracks in the cut surfaces when the first base resin layer 11 and the second base resin layer 13 are cut by a laser or the like, compared to a resin layer containing a photosensitive material.

Note that, the base material 3 may have, for example, a single-layer structure constituted by only the first base resin layer 11, or a multilayer structure of four or more layers.

The base coat layer 14 prevents moisture or impurities from entering into the TFT layer 4 and the light-emitting element 5. The base coat layer 14 is an inorganic insulating layer configured by containing an inorganic insulating material such as silicon oxide, silicon nitride, or silicon oxynitride, for example.

The TFT layer 4 includes a semiconductor layer 20, a gate insulating layer 21, a gate electrode GE, a first inorganic insulating layer 22, a capacitance electrode CE, a second inorganic insulating layer 23, a source electrode SE and a drain electrode DE, and a first flattening layer 24. Additionally, the TFT layer 4 includes a gate wiring line GW that is provided at the same layer as that of the gate electrode GE, and further includes a source wiring line (not illustrated) that is provided at the same layer as that of the source electrode SE and the drain electrode DE.

A plurality of thin film transistors Tr for driving the subpixel SP are constituted by the semiconductor layer 20, the gate insulating layer 21, the gate electrode GE, the first inorganic insulating layer 22, the second inorganic insulating layer 23, and the source electrode SE and the drain electrode DE.

The semiconductor layer 20 is formed on the base coat layer 14, and is formed at least in the formation region of the thin film transistor Tr. The semiconductor layer 20 is configured by containing low-temperature polysilicon (LTPS) or an oxide semiconductor, for example. The oxide semiconductor contains at least one metal element selected from In, Ga, and Zn.

The gate insulating layer 21 is provided on the base coat layer 14 so as to cover the semiconductor layer 20. A plurality of gate electrodes GE are provided on the gate insulating layer 21, in the formation regions of the thin film transistors Tr. Further, a plurality of gate wiring lines GW that are provided at the same layer as that of the gate electrodes GE are provided on the gate insulating layer 21. Each of the plurality of gate wiring lines GW is connected to the gate electrode GE.

The first inorganic insulating layer 22 is provided on the gate insulating layer 21 to cover the gate electrodes GE and the gate wiring lines GW. The capacitance electrode CE is provided on the first inorganic insulating layer 22, and overlaps a part of the gate wiring line GW. The capacitance electrode CE forms a capacitance with the overlapping gate wiring line GW. The second inorganic insulating layer 23 covers the capacitance electrode CE, and is provided on the first inorganic insulating layer 22 over the entire surface of the display region DA.

Each of the gate insulating layer 21, the first inorganic insulating layer 22, and the second inorganic insulating layer 23 is configured by containing, for example, an inorganic insulating material such as silicon oxide, silicon nitride, or silicon oxynitride.

The drain electrode DE and the source electrode SE are provided at the same layer, and a plurality of drain electrodes DE and a plurality of source electrodes SE are provided on the second inorganic insulating layer 23 in the formation regions of the thin film transistors Tr. The drain electrode DE is connected to a drain region of the semiconductor layer 20, and the source electrode SE is connected to a source region of the semiconductor layer 20, through contact holes formed in the first inorganic insulating layer 22 and the second inorganic insulating layer 23. Further, a plurality of source wiring lines (not illustrated) are provided at the same layer as that of the drain electrode DE and the source electrode SE on the second inorganic insulating layer 23. Each of the plurality of source wiring lines is connected to the source electrode SE.

The plurality of source wiring lines and the plurality of gate wiring lines GW are provided so as to intersect with each other in the display region DA in a plan view. Each of the plurality of source wiring lines is connected to a source driver (not illustrated), and a source signal corresponding to light emission luminance of each of the plurality of subpixels SP is supplied from the source driver. Each of the plurality of gate wiring lines GW is connected to a gate driver (not illustrated), and a gate signal for selecting a subpixel SP to be emitted from among the plurality of subpixels SP is supplied from the gate driver.

Each of the gate electrode GE, the gate wiring line GW, the capacitance electrode CE, the drain electrode DE, the source electrode SE, and the source wiring line is configured by containing a conductive material. Examples of the conductive material include metal materials such as aluminum, tungsten, molybdenum, tantalum, chromium, titanium, and copper, or an alloy thereof.

The first flattening layer 24 covers the drain electrodes DE, the source electrodes SE, and the source wiring lines, and is provided on the second inorganic insulating layer 23 over the entire display region DA. That is, the first flattening layer 24 covers the plurality of thin film transistors Tr. The first flattening layer 24 is, for example, a resin layer configured by containing a resin material such as polyimide, or acrylic. The first flattening layer 24 contains, for example, a photosensitive material, and is patterned by, for example, a photolithography method or the like.

The plurality of light-emitting elements 5 and the bank 25 are provided on the first flattening layer 24. The plurality of light-emitting elements 5 are individually provided so as to correspond to each subpixel SP. Each of the plurality of light-emitting elements 5 includes, for example, a first electrode 30, a first charge injection layer 31, a light-emitting layer 32, a second charge injection layer 33, and a second electrode 34 that are layered in order on the first flattening layer 24. For example, the first electrode 30, the first charge injection layer 31, the light-emitting layer 32, and the second charge injection layer 33 are provided in an island shape for each light-emitting element 5. For example, the second electrode 34 is provided over the entire surface of the second charge injection layer 33 and the bank 25.

The bank 25 covers a peripheral end portion (edge portion) of the first electrode 30. Thus, the bank 25 prevents a short circuit between the peripheral end portion of the first electrode 30 and the second electrode 34. The bank 25 is provided in a lattice pattern in the display region DA (see FIG. 1) in a plan view. That is, the light-emitting element 5 provided in an opening surrounded by the bank 25 corresponds to the subpixel SP. The bank 25 is, for example, a resin layer configured by containing, for example, a resin material such as polyimide, or acrylic. Also, the bank 25 contains, for example, a photosensitive material, and is patterned by a photolithography method, or the like.

The first electrode 30 is connected to the source electrode SE through a contact hole formed in the first flattening layer 24. The first electrode 30 is, for example, an anode electrode.

The first electrode 30 is, for example, a reflective electrode that reflects visible light. The first electrode 30 is configured as a layered structure of, for example, a reflective layer containing a metal material such as aluminum, copper, gold, or silver having high reflectivity of visible light, and a transparent layer containing ITO, IZO, ZnO, AZO, BZO, GZO, or the like that is a transparent conductive material. Note that the first electrode 30 may have a single-layer structure including a reflective layer.

The second electrode 34 is, for example, a cathode electrode. The second electrode 34 is, for example, a transparent electrode that transmits visible light. The second electrode 34 contains, for example, ITO, IZO, ZnO, AZO, BZO, GZO, or the like that is a transparent conductive material.

The first charge injection layer 31 is provided between the first electrode 30 and the light-emitting layer 32. The first charge injection layer 31 is, for example, a hole injection layer for injecting positive holes into the light-emitting layer 32.

The second charge injection layer 33 is provided between the second electrode 34 and the light-emitting layer 32. The second charge injection layer 33 is, for example, an electron injection layer for injecting electrons into the light-emitting layer 32. Note that another layer such as a hole transport layer may be provided between the first charge injection layer 31 and the light-emitting layer 32. In addition, another layer such as an electron transport layer may be provided between the second charge injection layer 33 and the light-emitting layer 32. Furthermore, at least one of the first charge injection layer 31 and the second charge injection layer 33 may be omitted.

The light-emitting layer 32 is provided between the first electrode 30 and the second electrode 34. In the present embodiment, the light-emitting layer 32 is provided between the first charge injection layer 31 and the second charge injection layer 33. The light-emitting layer 32 emits visible light based on, for example, positive holes injected from the first charge injection layer 31 and electrons injected from the second charge injection layer 33. For example, the light-emitting layer 32 emits red light, green light, or blue light. The light-emitting layer 32 may be, for example, an organic electro-luminescence (EL) layer containing an organic EL material, or a quantum dot layer containing a plurality of quantum dots that emit EL light.

Note that the layering order of the light-emitting element 5 is not limited to the order described above, and for example, the second electrode 34, the second charge injection layer 33, the light-emitting layer 32, the first charge injection layer 31, and the first electrode 30 may be layered in this order on the first flattening layer 24. In addition, for example, the first electrode 30 may be a cathode electrode, the first charge injection layer 31 may be an electron injection layer, the second charge injection layer 33 may be a hole injection layer, and the second electrode 34 may be an anode electrode. Additionally, the first electrode 30 may be a transparent electrode, and the second electrode 34 may be a reflective electrode.

The sealing layer 6 prevents moisture or impurities from entering into the light-emitting element 5. The sealing layer 6 covers the entire surface of the display region DA. The sealing layer 6 includes, for example, an inorganic film 40 provided on the second electrode 34, an organic film 41 provided on the inorganic film 40, and an inorganic film 42 provided on the organic film 41. The inorganic films 40 and 42 are inorganic insulating layers configured by containing an inorganic insulating material such as silicon oxide, silicon nitride, or silicon oxynitride. The organic film 41 is a resin layer configured by containing, for example, a resin material such as polyimide or acrylic.

The first film 7 is provided on the sealing layer 6. The first film 7 protects the front surface (upper surface) of the display panel 2, and has flexibility. The first film 7 is configured by containing, for example, a resin material such as polyethylene terephthalate (PET) resin.

Figure 3:
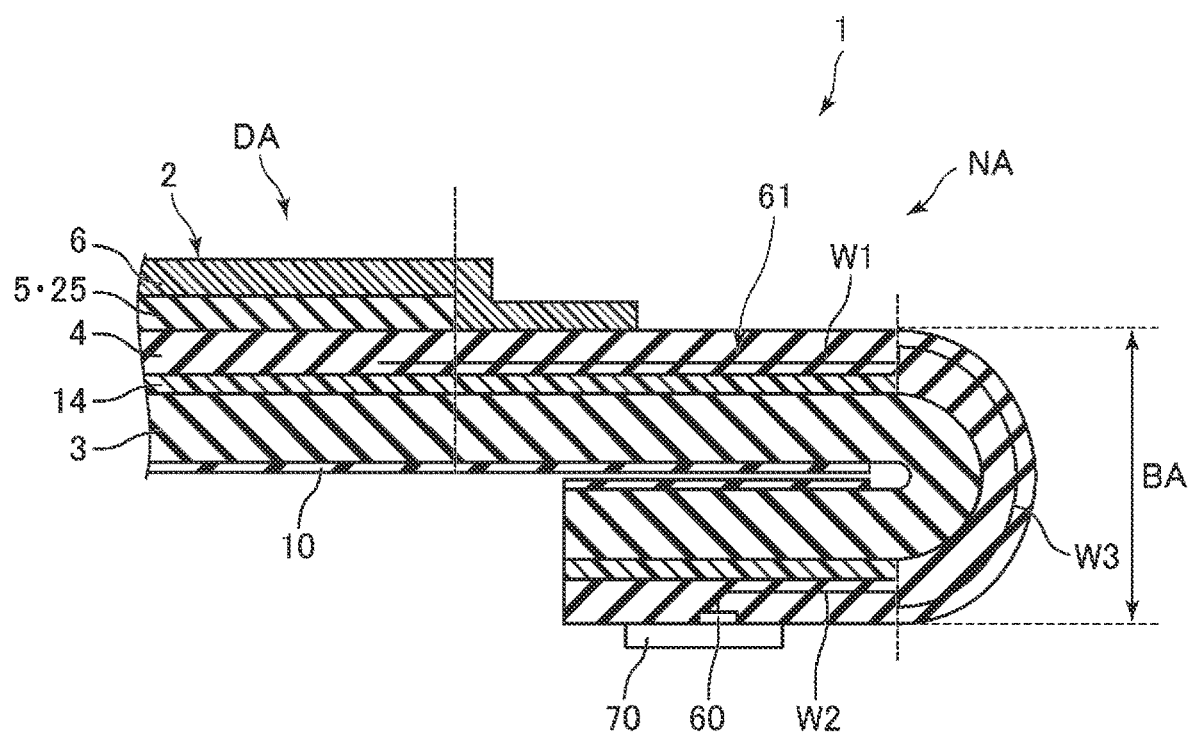
FIG. 3 is a schematic cross-sectional view illustrating a state in which the display panel in the display device according to the first embodiment is bent.

FIG. 3 is a schematic cross-sectional view illustrating a state in which the display panel 2 of the display device 1 according to the first embodiment is bent. Note that, in FIG. 3, illustration of the first film 7 is omitted. As illustrated in FIG. 3, the display device 1 includes a circuit substrate 70 electrically connected to the display panel 2 in addition to the display panel 2. The circuit substrate 70 is, for example, a substrate or the like on which an IC chip is mounted, and is disposed so as to overlap the back surface of the display panel 2. Then, the bending region BA is bendable by 180°, for example, in the display panel 2. In this way, the plurality of terminals 60 in the display panel 2 are individually electrically connected corresponding to the plurality of terminals provided on the circuit substrate 70 provided at the back surface side of the display panel 2. A curvature of bending the bending region BA may be freely-selected and designed, but is approximately equal to or larger than 0.1 mm and equal to or smaller than 1.0 mm, as an example. As a result, the display device 1 subjected to frame narrowing can be implemented.

Figure 4:
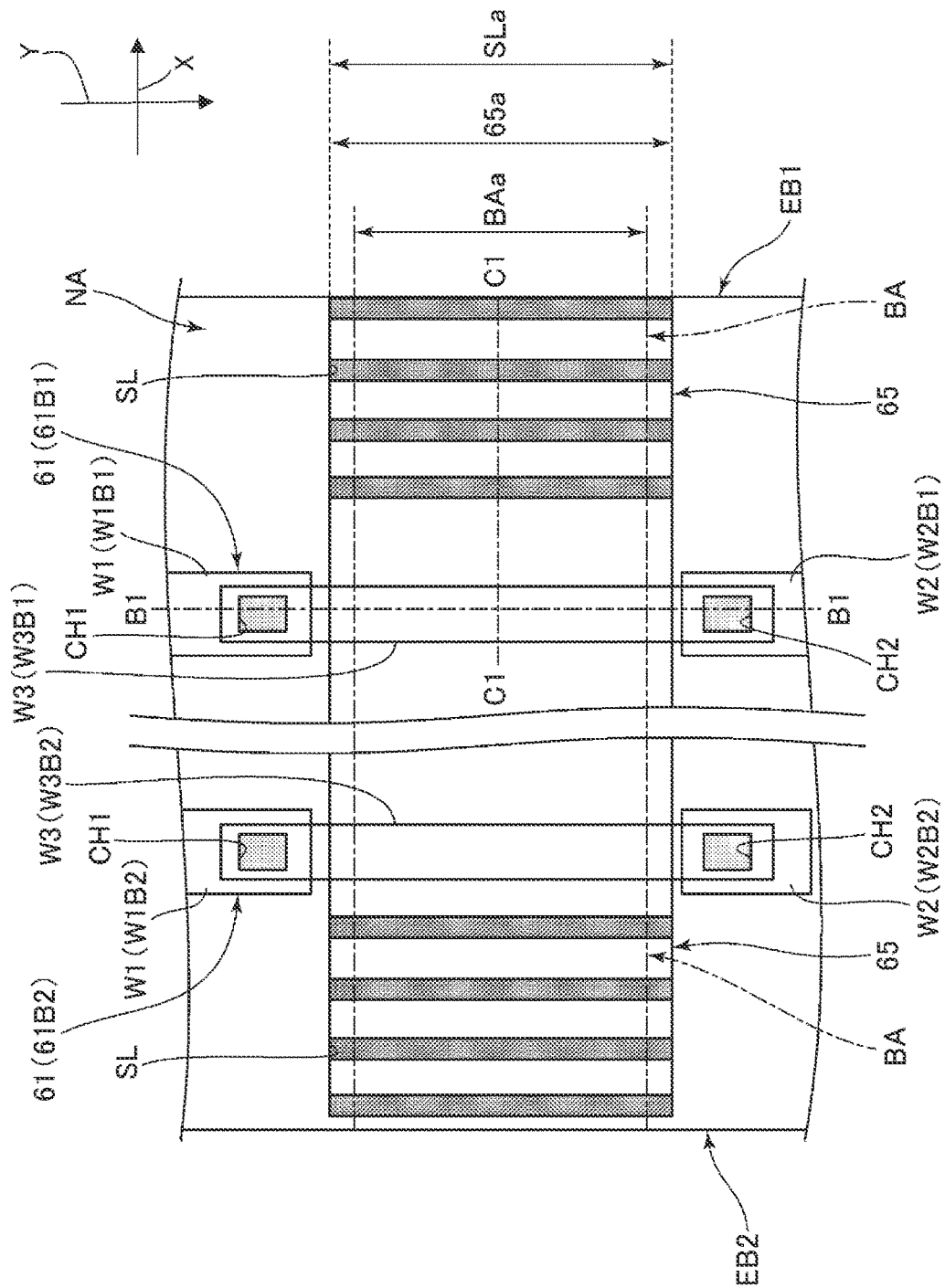
FIG. 4 is a plan view illustrating a schematic configuration near both end portions of the bending region of the display panel according to the embodiment.
Figure 5:
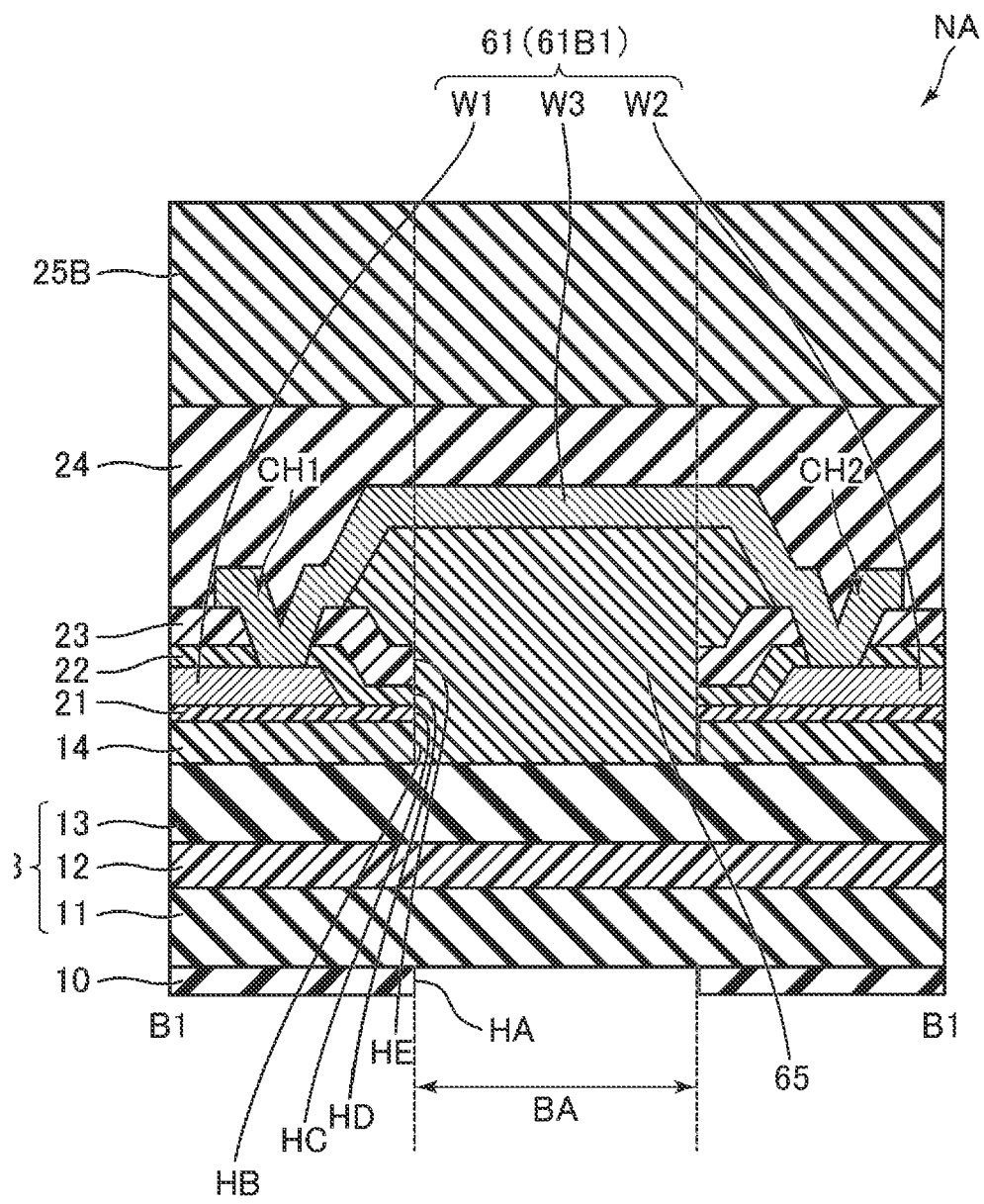
FIG. 5 is a cross-sectional view taken along a B1-B1 line illustrated in FIG. 4.

Next, a configuration of the frame region NA near the bending region BA will be described by primarily using FIG. 4 and FIG. 5. FIG. 4 is a plan view illustrating a schematic configuration near both the end portions EB1 and EB2 of the bending region BA of the display panel 2 according to the first embodiment. FIG. 5 is a cross-sectional view taken along a line B1-B1 illustrated in FIG. 4.

For example, among the lead-out wiring lines 61, the first lead-out wiring line W1 and the second lead-out wiring line W2 are provided at the same layer as that of the gate electrode GE, and the relay wiring line W3 is provided at the same layer as that of the drain electrode DE and the source electrode SE.

The relay wiring line W3 is electrically connected at one end portion thereof to an end portion of the first lead-out wiring line W1 through the first contact hole CH1 formed in the first inorganic insulating layer (first insulating layer) 22 and the second inorganic insulating layer (first insulating layer) 23 that cover the first lead-out wiring line W1. Additionally, the other end portion of the relay wiring line W3 is electrically connected to an end portion of the second lead-out wiring line W2 through the second contact hole CH2 formed in the first inorganic insulating layer (first insulating layer) 22 and the second inorganic insulating layer (first insulating layer) 23 that cover the second lead-out wiring line W2.

The base material 3 (that is, the first base resin layer 11, the buffer layer 12, and the second base resin layer 13) provided on the second film 10 is provided in the frame region NA, the base coat layer 14 is provided on the base material 3, the gate insulating layer 21 is provided on the base coat layer 14, and the first lead-out wiring line W1 and the second lead-out wiring line W2 are provided on the gate insulating layer 21. Furthermore, the first inorganic insulating layer 22 is provided on the gate insulating layer 21 so as to cover the first lead-out wiring line W1 and the second lead-out wiring line W2, the second inorganic insulating layer 23 is provided on the first inorganic insulating layer 22, the first flattening layer 24 is provided on the second inorganic insulating layer 23, and a resin layer 25B provided at the same layer as that of the bank 25 is provided on the first flattening layer 24. Furthermore, a filling layer 65 where a plurality of relay wiring lines W3 are layered on a surface thereof is provided in the bending region BA.

In the second film 10, an opening HA is formed in a region overlapping the bending region BA. The base material 3, the first base resin layer 11, the buffer layer 12, and the second base resin layer 13 are provided continuously over the entire surface of the display panel 2 including the bending region BA. The back surface of the first base resin layer h is exposed in the bending region BA through the opening HA formed in the second film 10.

In the base coat layer (second insulating layer) 14 provided at the lower layer of the first lead-out wiring line W1 and the second lead-out wiring line W2, an opening HB is formed in a region overlapping the bending region BA. In the gate insulating layer (second insulating layer) 21 provided at the lower layer of the first lead-out wiring line W1 and the second lead-out wiring line W2, an opening HC is formed in the region overlapping the bending region BA. In the first inorganic insulating layer (first insulating layer) 22 provided at the upper layer of the first lead-out wiring line W1 and the second lead-out wiring line W2, an opening HD is formed in the region overlapping the bending region BA.

In the second inorganic insulating layer (first insulating layer) 23 provided at the upper layer of the first lead-out wiring line W1 and the second lead-out wiring line W2, an opening HE is formed in the region overlapping the bending region BA.

The surface of the second base resin layer 13 in the bending region BA is exposed through the openings HB to HE.

For example, lengths in the Y direction of the openings HB to HE are substantially the same. Also, for example, the lengths in the Y direction of the openings HB to HE are substantially the same as a length in the Y direction of the opening HA. As an example, a length BAa in the Y direction of the bending region BA is substantially the same as the lengths in the Y direction of the openings HA to HE. Also, the openings HA to HE continuously extend in the X direction so as to connect both the end portions EB1 and EB2 to each other. That is, in the bending region BA, the openings HA to HE extend in a direction intersecting the plurality of relay wiring lines W3.

For example, a length in the Y direction between the end portion of the first lead-out wiring line W1 (the end portion at the side closer to the bending region BA) and the end portion of the second lead-out wiring line W2 (the end portion at the side closer to the bending region BA) is longer than the lengths in the Y direction of the openings HB to HE. In other words, each of the end portion of the first lead-out wiring line W1 (the end portion at the side closer to the bending region BA) and the end portion of the second lead-out wiring line W2 (the end portion at the side closer to the bending region BA) is covered with the first inorganic insulating layer 22 and the second inorganic insulating layer 23.

The filling layer 65 is provided in a region surrounded by the surface of the second base resin layer 13 exposed in the bending region BA, the opening HB formed in the base coat layer 14, the opening HC formed in the gate insulating layer 21, the opening HD formed in the first inorganic insulating layer 22, and the opening HE formed in the second inorganic insulating layer 23. The filling layer 65 continuously extends in the X direction so as to connect both the end portions EB1 and EB2 to each other.

The filling layer 65 is a resin layer configured by containing, for example, a resin material such as polyimide or acrylic. Furthermore, the filling layer 65 contains a photosensitive material to be patterned by a photolithography method, or the like, for example. The relay wiring line W3 extending in the Y direction is provided on the filling layer 65.

The first flattening layer 24 is provided on the filling layer 65 and the second inorganic insulating layer 23 so as to cover the relay wiring line W3.

The resin layer 25B is provided in the bending region BA in order to reinforce the bending region BA. The resin layer 25B is, for example, at the same layer as that of the bank 25 in the display region DA, and is provided so as to be separated from the bank 25. Note that the resin layer 25B in the bending region BA may be omitted.

In this way, for example, it is preferable that layers (the base coat layer 14, the gate insulating layer 21, the first inorganic insulating layer 22, and the second inorganic insulating layer 23) formed by using inorganic insulating materials that have lower bending resistance than that of the resin layers be not formed except for the buffer layer 12 included in the base material 3 in the bending region BA.

Figure 6:
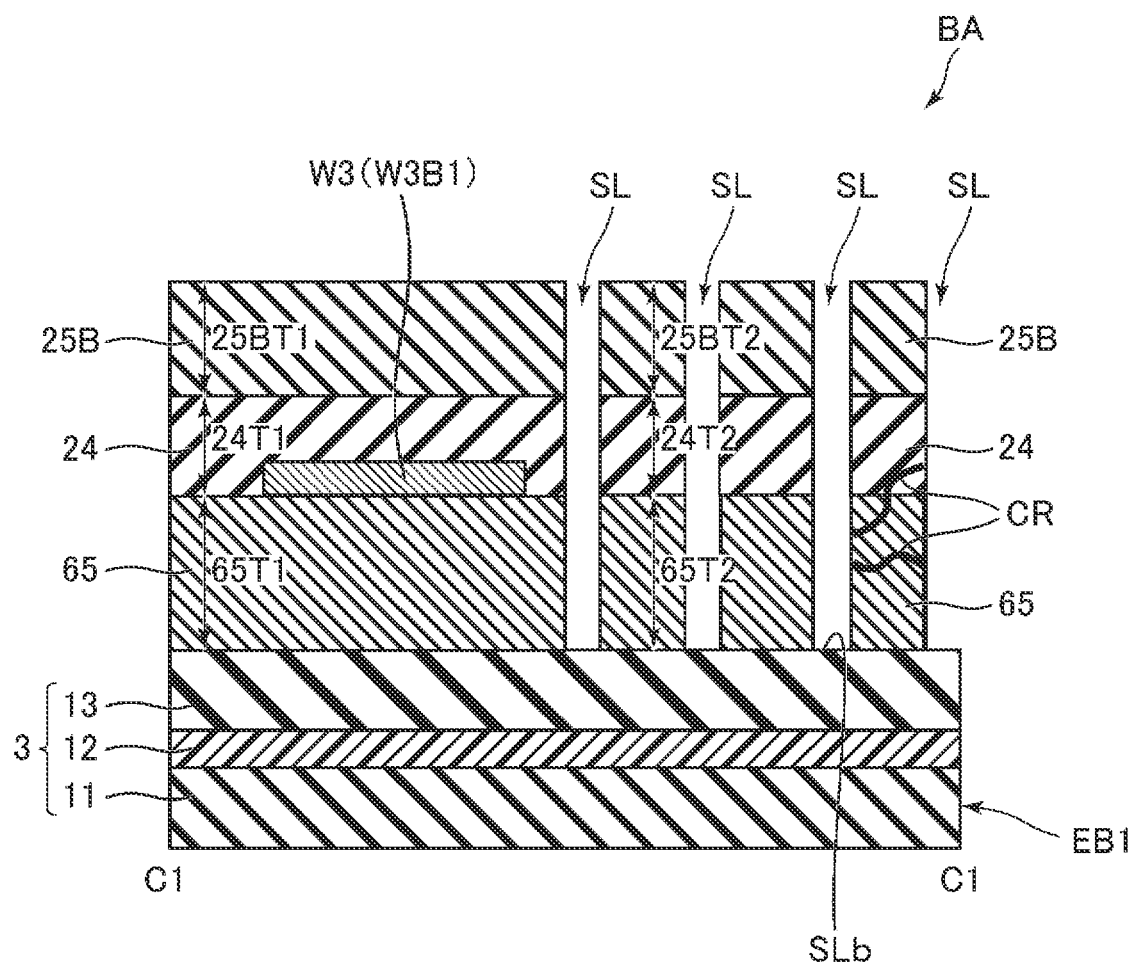
FIG. 6 is a cross-sectional view taken along a C1-C1 line illustrated in FIG. 4.
Figure 6:
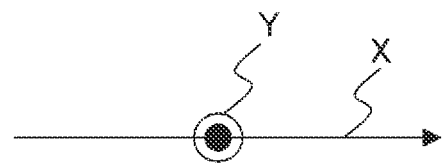
Figure 7:
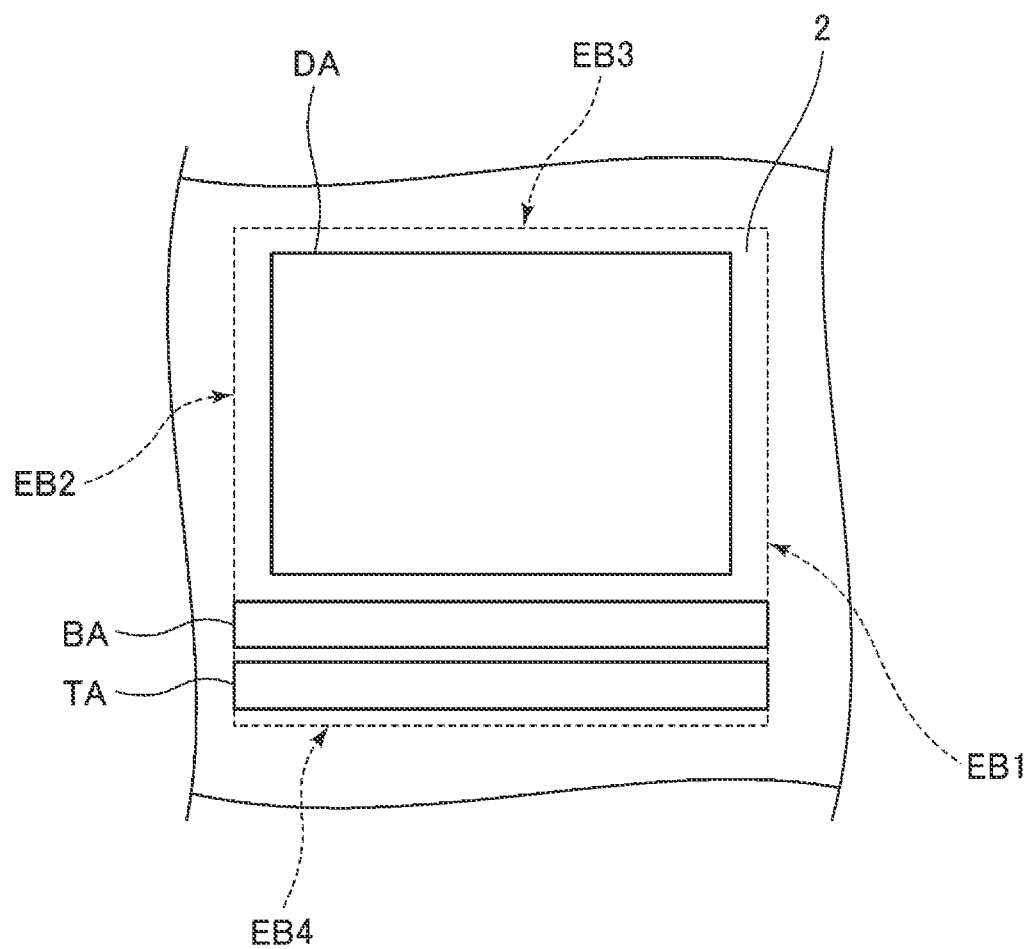
FIG. 7 is a diagram illustrating a state of a singulation step of the display device according to the first embodiment.

Next, with reference to FIG. 4 to FIG. 7, details of the plurality of slits SL formed in the bending region BA will be described. FIG. 6 is a cross-sectional view taken along a C1-C1 line illustrated in FIG. 4. FIG. 7 is a diagram illustrating a state of a singulation step of the display device 1 according to the embodiment.

As illustrated in FIG. 4 and FIG. 5, in the bending region BA, as described above, for example, the filling layer 65, the first flattening layer 24, and the resin layer 25B are layered in order on the base material 3. In other words, a layered structure in which the plurality of resin layers are layered is used in the bending region BA.

Then, as illustrated in FIG. 7, after the display panel 2 is formed in a size larger than a desired size, in the singulation step, the four end portions EB1 to EB4 are cut into the desired size by using a laser or the like.

Here, each of the filling layer 65, the first flattening layer 24, and the resin layer 25B contains a photosensitive material for patterning. Thus, the filling layer 65, the first flattening layer 24, and the resin layer 25B have low heat resistance compared to the resin layers (for example, the first base resin layer 11 and the second base resin layer 13) not containing a photosensitive material, and cannot be cured at a relatively high temperature, such as, for example, a temperature of approximately 250° C.

As a result, cracks CR may be generated in the filling layer 65, the first flattening layer 24, and the resin layer 25B in directions from the end portions EB1 and EB2 that are cut surfaces in the bending region BA compared to the resin layers (for example, the first base resin layer 11 and the second base resin layer 13) in which a photosensitive material is not contained, toward the inner sides of each of the filling layer 65 and the first flattening layer 24.

Thus, as illustrated in FIG. 4 and FIG. 6, in the display panel 2 according to the present embodiment, the filling layer 65 (first resin layer) and the first flattening layer 24 (second resin layer) in the bending region BA are provided with the plurality of slits SL having a depth from a surface of the first flattening layer 24 (the second resin layer) to the filling layer 65 (the first resin layer) at outer sides than the relay wiring lines W3B1 and W3B2 positioned at both ends among the plurality of relay wiring lines W3 in a plan view.

This can suppress that, even in a case where cracks CR are generated in directions from the end portions EB1 and EB2 toward inner sides of each of the filling layer 65 and the first flattening layer 24 in the bending region BA when the display panel 2 is cut into a desired size in the singulation step, the cracks CR are generated toward inner sides from the plurality of slits SL. This makes it possible to suppress disconnection of the plurality of relay wiring lines W3 by the cracks CR.

As an example, each of the end portions EB1 and EB2 in the bending region BA overlaps the slits SL provided at both ends among the slits SL. That is, the end portions EB1 and EB2 in the bending region BA are not covered by the filling layer 65, and are exposed. In other words, the slits SL provided at both ends coincide with cutting lines when the end portions EB1 and EB2 are cut. Note that the end portions EB1 and EB2 in the bending region BA may be covered with the filling layer 65.

In this way, each of the end portions EB1 and EB2 overlaps the slit SL, and thus, when the end portions EB1 and EB2 are cut, the cracks CR can more reliably be prevented from being generated in the directions toward the inner sides of each of the filling layer 65 and the first flattening layer 24.

Additionally, in the present embodiment, at least one of the plurality of slits SL preferably passes through the filling layer 65 in the Y direction. In other words, the plurality of slits SL are formed so as to extend along the Y direction (that is, along the end portions EB1 and EB2), and at least one of the plurality of slits SL has a length SLa in the Y direction being preferably the same as a length 65a of the filling layer 65 in the Y direction. According to this, generation of the cracks CR from the end portions EB1 and EB2 of the filling layer 65 toward the inner sides of the filling layer 65 can be more reliably suppressed by at least one of the plurality of slits SL. Thus, disconnection of the plurality of relay wiring lines W3 due to the cracks CR can more reliably be suppressed.

Note that, although all of the plurality of slits SL preferably penetrate the filling layer 65 in the Y direction, it is only required that at least one of the plurality of slits SL penetrates the filling layer 65 in the Y direction.

Additionally, in the present embodiment, at least one of the plurality of slits SL preferably has a depth extending through the first flattening layer 24 (second resin layer) and the filling layer 65 (first resin layer). In other words, in the bending region BA, at least one bottom surface SLb of the plurality of slits SL is preferably a surface of the second base resin layer 13. This can more reliably suppress generation of cracks CR from the end portions EB1 and EB2 of each of the first flattening layer 24 and the filling layer 65 toward the inner sides of each of the first flattening layer 24 and the filling layer 65 in the bending region BA due to at least one of the plurality of slits SL. Thus, disconnection of the plurality of relay wiring lines W3 due to the cracks CR can more reliably be suppressed.

Here, in the present embodiment, the case where the resin layer 25B is further provided on the first flattening layer 24 in the bending region BA has been described. Thus, at least one of the plurality of slits SL preferably has a depth extending through the resin layer 25B in addition to the first flattening layer 24 and the filling layer 65. This can more reliably suppress that the cracks CR generated from the end portions EB1 and EB2 are generated toward the further inner sides, and can suppress disconnection of the plurality of relay wiring lines W3.

Note that all of the plurality of slits SL preferably have a depth extending through the first flattening layer 24 and the filling layer 65, but at least one of the plurality of slits SL may have a depth extending through the first flattening layer 24 and the filling layer 65.

Note that as illustrated in FIG. 4 and FIG. 6, for example, in the filling layer 65 in the bending region BA, a thickness 65T2 at outer sides than the relay wiring lines W3B1 and W3B2 positioned at both ends among the plurality of relay wiring lines W3 and a thickness 65T1 of a region surrounded by the relay wiring lines W3B1 and W3B2 positioned at both ends are the same. In addition, for example, in the first flattening layer 24 in the bending region BA, a thickness 24T2 at outer sides than the relay wiring lines W3B1 and W3B2 positioned at the both ends among the plurality of relay wiring lines W3 and a thickness 24T1 of a region surrounded by the relay wiring lines W3B1 and W3B2 positioned at both ends are the same. Also, in the resin layer 25B in the bending region BA, a thickness 25BT2 at outer sides than the relay wiring lines W3B1 and W3B2 positioned at the both ends among the plurality of relay wiring lines W3 and a thickness 25BT1 in a region surrounded by the relay wiring lines W3B1 and W3B2 positioned at the both ends are the same.

Figure 8:
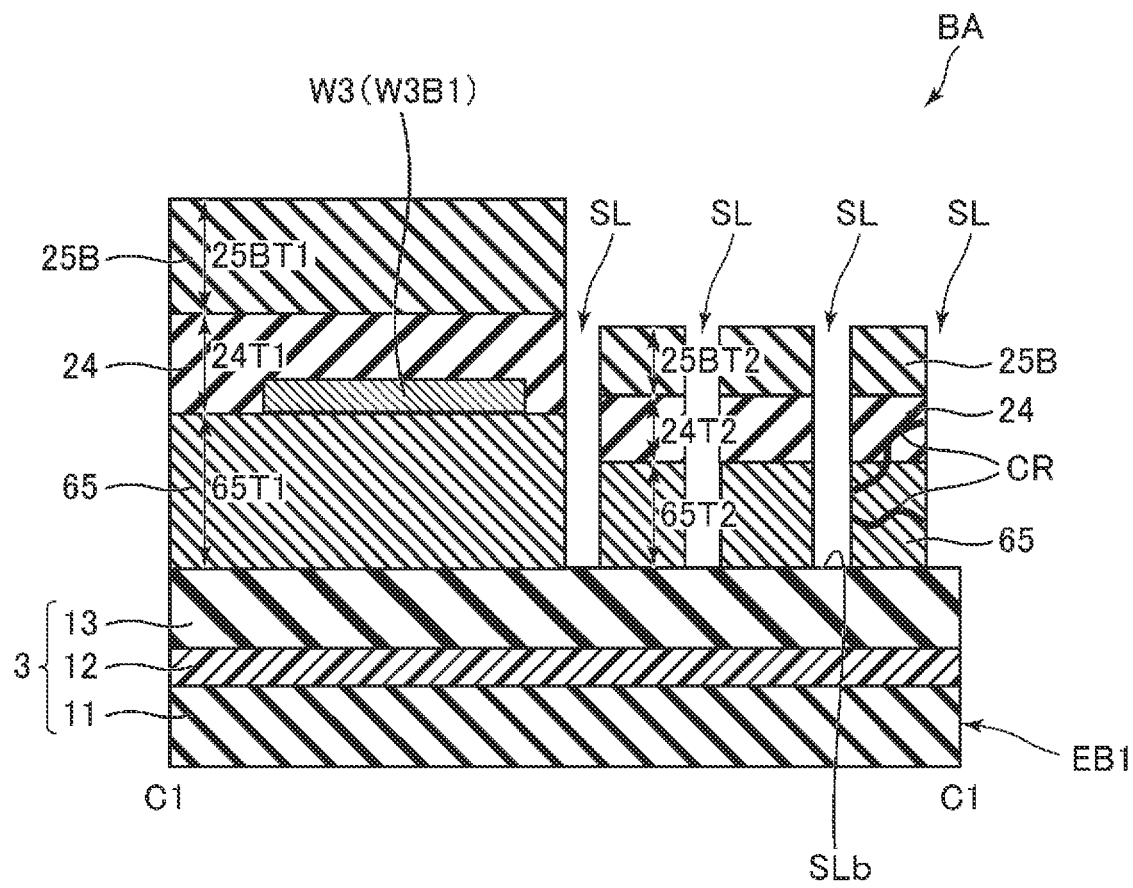
FIG. 8 is a cross-sectional view of a bending region according to a modified example of the first embodiment.

FIG. 8 is a cross-sectional view of the bending region according to a modified example of the first embodiment. FIG. 8 illustrates a modified example of the cross section taken along a C1-C1 line illustrated in FIG. 4.

As illustrated in FIG. 4 and FIG. 8, in the filling layer 65 in the bending region BA, a thickness 65T2 at outer sides than the relay wiring lines W3B1 and W3B2 positioned at the both ends among the plurality of relay wiring lines W3 may be thinner than a thickness 65T1 of a region surrounded by the relay wiring lines W3B1 and W3B2 positioned at the both ends. This can more reliably suppress that, in the filling layer 65 in the bending region BA, the cracks CR generated from the end portions EB1 and EB2 are generated toward the further inner side, and can suppress disconnection of the plurality of relay wiring lines W3.

Also, in the first flattening layer 24 in the bending region BA, a thickness 24T2 at outer sides than the relay wiring lines W3B1 and W3B2 positioned at the both ends among the plurality of relay wiring lines W3 may be thinner than a thickness 24T1 of a region surrounded by the relay wiring lines W3B1 and W3B2 positioned at the both ends. This can more reliably suppress that, in the first flattening layer 24 of the bending region BA, the cracks CR generated from the end portions EB1 and EB2 are generated toward the further inner sides, and can suppress disconnection of the plurality of relay wiring lines W3.

Also, in the resin layer 25B in the bending region BA, a thickness 25BT2 at outer sides than the relay wiring lines W3B1 and W3B2 positioned at the both ends among the plurality of relay wiring lines W3 may be thinner than a thickness 25BT1 of a region surrounded by the relay wiring lines W3B1 and W3B2 positioned at the both ends. This more reliably suppresses that, in the resin layer 25B in the bending region BA, the cracks CR generated from the end portions EB1 and EB2 are generated toward the further inner sides, and can suppress disconnection of the plurality of relay wiring lines W3.

The thickness of a partial film thickness of each of the resin layer 25B, the first flattening layer 24, and the filling layer 65 can be reduced, for example, by a photolithography method using a graytone mask or a halftone mask, or the like.

Furthermore, a part of the relay wiring line W3 may be made thinner than the drain electrode, the source electrode, and the source wiring line at the same layer as that of the relay wiring line W3.

Figure 9:
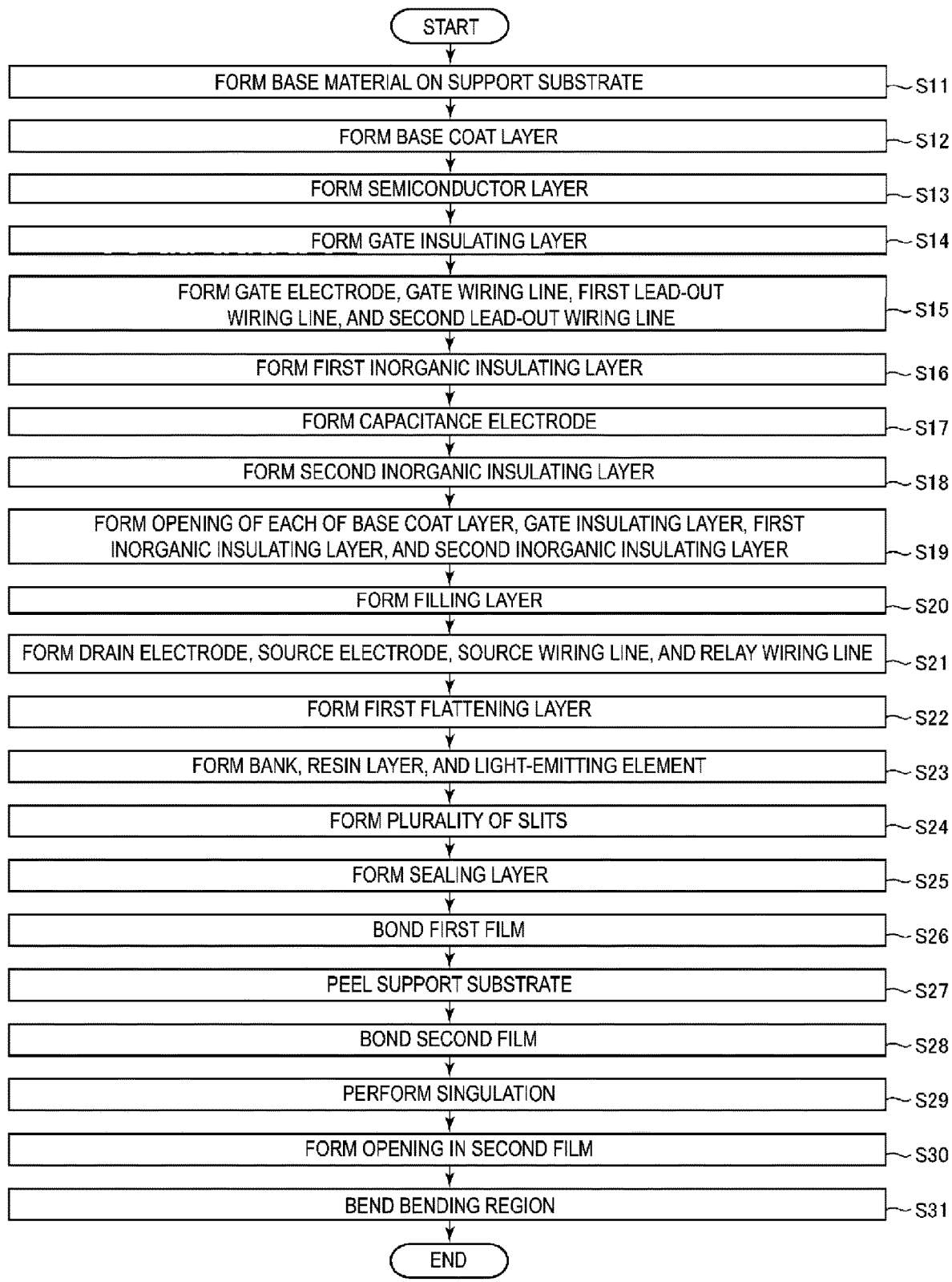
FIG. 9 is a flowchart illustrating a manufacturing process of the display device according to the first embodiment.

Next, a manufacturing method of the display device 1 will be described. FIG. 9 is a flowchart illustrating a manufacturing process of the display device 1 according to the embodiment.

First, the base material 3 is formed on a support substrate having transparency (for example, mother glass) (step S11). That is, the first base resin layer 11 is formed by applying and heating a resin material such as polyimide on a surface of the support substrate. Next, the buffer layer 12 is formed on the surface of the first base resin layer 11 by a CVD method, or the like, using an inorganic insulating material such as silicon oxide, silicon nitride, or silicon oxynitride. Next, a resin material such as polyimide is applied and heated to form the second base resin layer 13 on the surface of the buffer layer 12. The first base resin layer 11 and the second base resin layer 13 do not contain a photosensitive material, and are formed by, for example, heating at a relatively high temperature of approximately 500° C.

Next, the base coat layer 14 is formed on the surface of the base material 3 by a CVD method or the like using an inorganic insulating material such as silicon oxide, silicon nitride, or silicon oxynitride (step S12). Next, the semiconductor layer 16 is formed by using polysilicon, an oxide semiconductor material, or the like in the formation region of the thin film transistor Tr (step S13).

Next, the gate insulating layer 21 is formed on the surface of the base coat layer 14 so as to cover the semiconductor layer 16 by a CVD method or the like using an inorganic insulating material such as silicon oxide, silicon nitride, or silicon oxynitride (step S14). Next, a metal material such as aluminum, tungsten, molybdenum, tantalum, chromium, titanium, or copper, or an alloy thereof is formed on the surface of the gate insulating layer 21 by a sputtering method or the like, and the gate electrode GE, the gate wiring line GW, the first lead-out wiring line W1, and the second lead-out wiring line W2 are formed by a photolithography method (step S15). In this manner, the gate electrode GE, the gate wiring line GW, the first lead-out wiring line W1, and the second lead-out wiring line W2 are formed by using the same material in the same step, that is, at the same layer.

Next, the first inorganic insulating layer 22 is formed on the surface of the gate insulating layer 21 so as to cover the gate electrode GE, the gate wiring line GW, the first lead-out wiring line W1, and the second lead-out wiring line W2, by a CVD method or the like using an inorganic insulating material such as silicon oxide, silicon nitride, or silicon oxynitride (step S16). Next, a metal material such as aluminum, tungsten, molybdenum, tantalum, chromium, titanium, or copper, or an alloy thereof is film-formed on the surface of the first inorganic insulating layer 22 by a sputtering method or the like, and the capacitance electrode CE is formed by a photolithography method (step S17).

Next, the second inorganic insulating layer 23 is formed on the surface of the first inorganic insulating layer 22 so as to cover the capacitance electrode CE by a CVD method or the like using an inorganic insulating material such as silicon oxide, silicon nitride, or silicon oxynitride (step S18).

Next, the second inorganic insulating layer 23, the first inorganic insulating layer 22, the gate insulating layer 21, and the base coat layer 14 in the bending region BA are removed by etching, and thus, the openings HB to HE are collectively formed (step S19). This exposes the surface of the second base resin layer 13 in the bending region BA.

Next, the filling layer 65 is formed in the region surrounded by the openings HB to HE on the exposed surface of the second base resin layer 13 in the bending region BA by a photolithography method or the like using a resin material such as polyimide, or acrylic (step S20).

Next, a metal material such as aluminum, tungsten, molybdenum, tantalum, chromium, titanium, or copper, or an alloy thereof is film-formed on the surface of the second inorganic insulating layer 23 by a sputtering method or the like, and the drain electrode DE, the source electrode SE, and the source wiring line are formed by a photolithography method and the relay wiring line W3 is formed at the surface of the filling layer 65, at the same layer as each other (step S21). This forms the plurality of relay wiring lines W3 between the display region DA and the terminal region TA. In this manner, the drain electrode DE, the source electrode SE, the source wiring line, and the relay wiring line W3 are formed by using the same material in the same step, that is, at the same layer.

Here, in the display region DA, the drain electrode DE is connected to the drain region of the semiconductor layer 20 and the source electrode SE is connected to the source region of the semiconductor layer 20, through a contact hole formed so as to penetrate through the first inorganic insulating layer 22 and the second inorganic insulating layer 23 in advance. Thus, the thin film transistors Tr are formed in the display region DA.

In addition, near the bending region BA, one end portion of the relay wiring line W3 is connected to one end portion of the first lead-out wiring line W1 through the first contact hole CH1 formed so as to penetrate through the first inorganic insulating layer 22 and the second inorganic insulating layer 23 in advance, and the other end portion of the relay wiring line W3 is connected to one end portion of the second lead-out wiring line W2 through the second contact hole CH2. The plurality of relay wiring lines W3 are aligned and formed at the surface of the filling layer 65 in a direction in which the bending region BA extends. Due to this, the plurality of relay wiring lines W3 electrically connect the display region DA and the terminal region TA through the bending region BA. As a result, a plurality of lead-out wiring lines 61 are formed in the frame region NA.

Next, the first flattening layer 24 is formed on the surface of the second inorganic insulating layer 23 and the surface of the filling layer 65 so as to cover the thin film transistor Tr and the relay wiring line W3 by a photolithography method or the like using a resin material such as polyimide, or acrylic (step S22).

Next, the first electrode 30, the bank 25, the light-emitting element 5, and the resin layer 25B are formed at the surface of the first flattening layer 24 (step S23).

That is, for example, each of a reflective layer containing a metal material such as aluminum, copper, gold, or silver, and a transparent layer containing ITO, IZO, ZnO, AZO, BZO, GZO, or the like is formed to be patterned on the surface of the first flattening layer 24 by a photolithography method, thereby forming the first electrode 30 in the formation region of the light-emitting element 5. In this way, the first electrode 30 is connected to the drain electrode DE through the contact hole formed so as to penetrate through the first flattening layer 24 in advance.

In addition, in the display region DA, the bank 25 is formed in a lattice pattern on the surface of the first flattening layer 24 so as to cover a peripheral end portion (edge portion) of the first electrode 30 and the resin layer 25B is formed on the surface of the first flattening layer 24 near the bending region BA, by a photolithography method or the like using a resin material such as polyimide or acrylic.

Then, in the display region DA, the first charge injection layer 31, the light-emitting layer 32, and the second charge injection layer 33 are formed in order, by a vapor deposition method, or the like, in the region surrounded by the bank 25 on the first electrode 30. Then, the second electrode 34 is formed on the surface of the bank 25 and the surface of the second charge injection layer 33 by a vapor deposition method, or the like, using a transparent conductive material such as ITO, IZO, ZnO, AZO, BZO, or GZO. Thereby, the plurality of light-emitting elements 5 are formed in the display region DA.

Next, near the bending region BA, the filling layer 65, the first flattening layer 24, and the resin layer 25B are formed with a plurality of slits SL having a depth from the surface of the resin layer 25B to the filling layer 65 at outer sides than the relay wiring lines W3B1 and W3B2 positioned at both ends among the plurality of relay wiring lines W3 in a plan view (step S24). The plurality of slits SL can be formed, for example, by etching or the like.

Note that when the resin layer 25B is not formed in the bending region BA, the plurality of slits SL are formed so as to have the depth from the surface of the first flattening layer 24 to the filling layer 65. In the present embodiment, the plurality of slits SL are formed so as to penetrate through the filling layer 65 in a depth direction such that the surface of the second base resin layer 13 that is the lower layer of the filling layer 65 is exposed at bottom surfaces SLb of the plurality of slits SL. Note that the step S24 of forming the plurality of slits SL may be performed before the singulation step S30, which will be described later, after the bank 25 and the resin layer 25B are formed.

Next, the sealing layer 6 is formed (step S25). That is, the inorganic film 40, the organic film 41, and the inorganic film 42 are sequentially layered on the surfaces of the second electrode 34 and the first flattening layer 24. The inorganic films 40 and 42 are formed by using an inorganic insulating material such as silicon oxide, silicon nitride, or silicon oxynitride, for example, by a CVD method, or the like. The organic film 41 is formed by using a resin material such as polyimide, or acrylic by an ink-jet method or the like.

Next, the first film 7 containing a resin material such as polyethylene terephthalate (PET) is bonded to the surface of the sealing layer 6 (step S26). Next, the first base resin layer 11 is irradiated with, for example, a laser from the back surface side of the support substrate through the support substrate to peel the support substrate off from the back surface of the first base resin layer 11 (step S27). Next, the second film 10 containing a resin material such as polyethylene terephthalate (PET) is bonded to the back surface of the first base resin layer 11 with the support substrate peeled off (step S28).

Next, the end portions EB1 to EB4 that are outer edges of the display panel 2 are cut with a laser or the like so that the display panel 2 has a desired size. Thus, the display panel 2 is singulated to a desired size (step S29). Here, near the bending region BA, the filling layer 65, the first flattening layer 24, and the resin layer 25B are formed with the plurality of slits SL having the depth from the surface of the resin layer 25B to the filling layer 65 at outer sides than the relay wiring lines W3B1 and W3B2 positioned at the both ends among the plurality of relay wiring lines W3 in a plan view, and thus, even when cracks CR are generated from the end portions EB1 and EB2, disconnection of the plurality of relay wiring lines W3 in the bending region BA due to the cracks CR can be suppressed.

Next, the opening HA is formed in a region of the second film 10 that overlaps the bending region BA (step S30). Next, the bending region BA of the singulated display panel 2 is bent, for example, by 180° (step S31). In addition, the plurality of terminals 60 in the terminal region TA are electrically connected to the corresponding plurality of terminals provided on the circuit substrate 70 provided at the back surface side of the display panel 2. This completes the display device 1.

Second Embodiment

Figure 10:
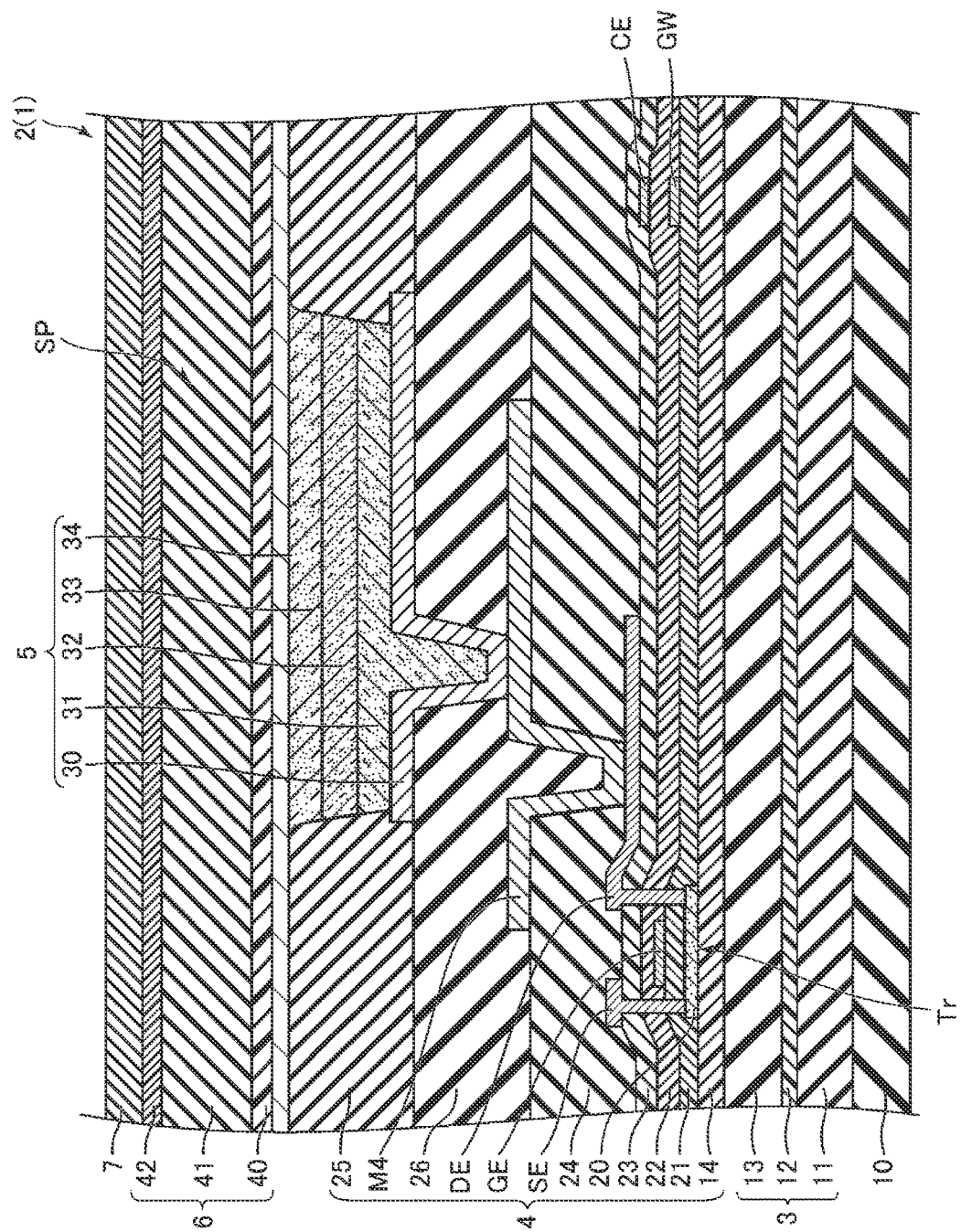
FIG. 10 is a cross-sectional view of a display panel in a display device according to a second embodiment near a subpixel.

A second embodiment of the disclosure will be described below. Note that a difference from the first embodiment will be mainly described, and a description of contents overlapping the first embodiment will be omitted. FIG. 10 is a cross-sectional view of the display panel 2 of the display device 1 according to the second embodiment near the subpixel SP. Note that a planar shape of the display panel 2 of the display device 1 according to the second embodiment is similar to that in FIG. 1.

As illustrated in FIG. 10, the TFT layer 4 in the display panel 2 may further include an intermediate electrode M4 and a second flattening layer 26.

The intermediate electrode M4 is provided in an island shape on the first flattening layer 24, and is electrically connected to the drain electrode DE through a contact hole formed in the first flattening layer 24. The intermediate electrode M4 electrically connects the drain electrode DE and the first electrode 30. In addition, a wiring line such as a lead-out wiring line is provided at the same layer as that of the intermediate electrode M4 in the frame region NA. The intermediate electrode M4 and the wiring line provided at the same layer as that of the intermediate electrode M4 are configured by containing a conductive material. Examples of the conductive material include metal materials such as aluminum, tungsten, molybdenum, tantalum, chromium, titanium, and copper, or an alloy thereof.

The second flattening layer 26 covers the intermediate electrode M4, and is provided over the entire surface of the display region DA on the first flattening layer 24. The second flattening layer 26 is, for example, a resin layer configured by containing a resin material such as polyimide, or acrylic. The second flattening layer 26 is, for example, patterned by containing a photosensitive material, for example, by a photolithography method, or the like.

The plurality of light-emitting elements 5 and the bank 25 are provided on the second flattening layer 26 in the present embodiment. The first electrode 30 is connected to the intermediate electrode M4 through a contact hole formed in the second flattening layer 26. That is, the first electrode 30 is electrically connected to the drain electrode DE through the intermediate electrode M4.

Figure 11:
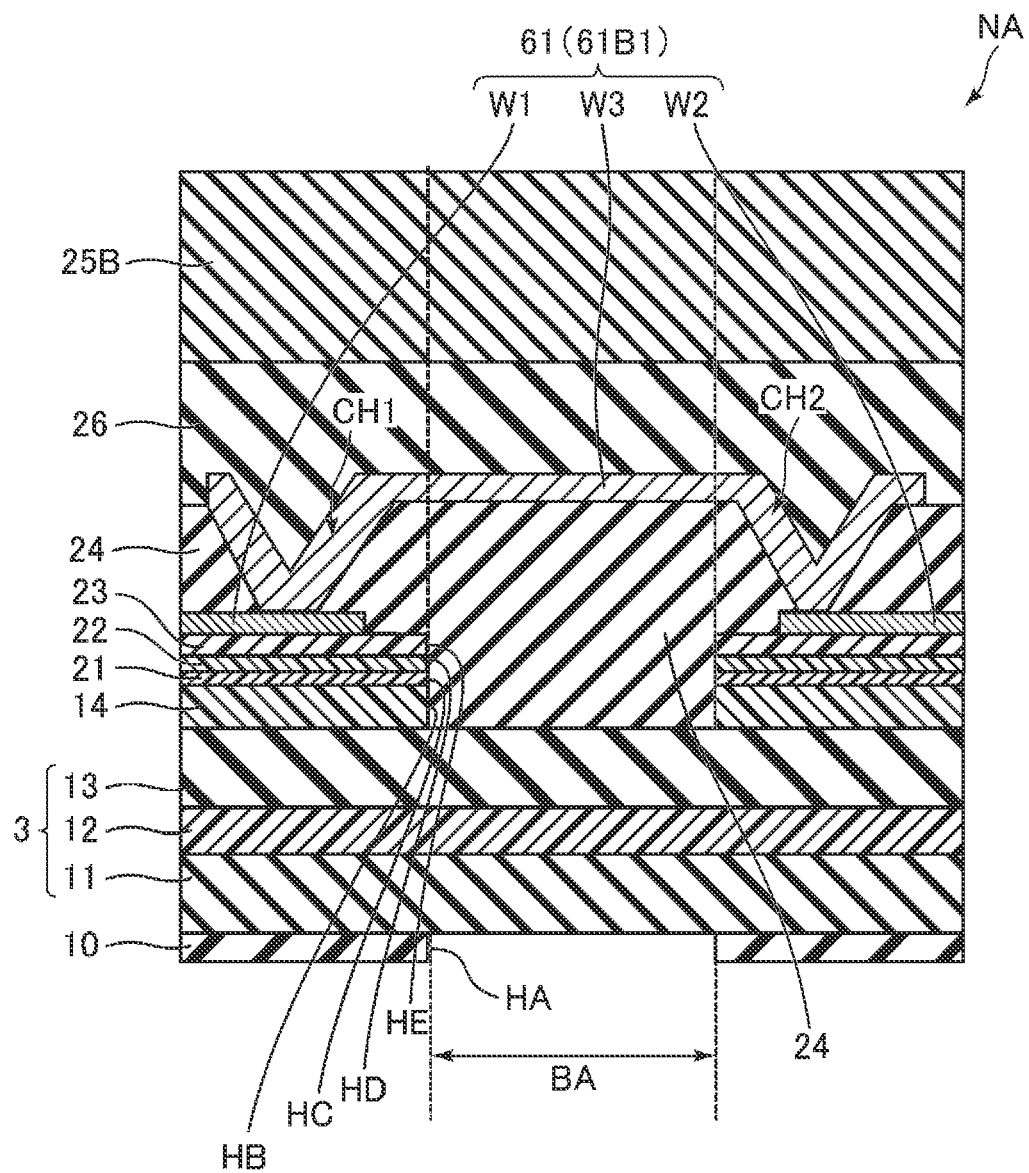
FIG. 11 is a cross-sectional view obtained by taking a lead-out wiring line at one end near the bending region according to the second embodiment in a Y direction.

FIG. 11 is a cross-sectional view obtained by taking the lead-out wiring line 61B1 at one end near the bending region BA according to the second embodiment along the Y direction.

In the second embodiment, for example, among the lead-out wiring lines 61, the first lead-out wiring line W1 and the second lead-out wiring line W2 are provided at the same layer as that of the source electrode SE and the drain electrode DE, and the relay wiring line W3 is provided at the same layer as that of the intermediate electrode M4.

The relay wiring line W3 is electrically connected at one end portion thereof to the end portion of the first lead-out wiring line W1 through the first contact hole CH1 formed in the first flattening layer (first insulating layer) 24 covering the first lead-out wiring line W1. Additionally, the relay wiring line W3 is electrically connected at the other end portion thereof to the end portion of the second lead-out wiring line W2 through the second contact hole CH2 formed in the first flattening layer (first insulating layer) 24 covering the second lead-out wiring line W2.

In the frame region NA, the base material 3 (that is, the first base resin layer 11, the buffer layer 12, and the second base resin layer 13) provided on the second film 10 is provided, the base coat layer 14 is provided on the base material 3, the gate insulating layer 21 is provided on the base coat layer 14, the first inorganic insulating layer 22 is provided on the gate insulating layer 21, the second inorganic insulating layer 23 is provided on the first inorganic insulating layer 22, and the first lead-out wiring line W1 and the second lead-out wiring line W2 are provided on the second inorganic insulating layer 23. Furthermore, the first flattening layer 24 is provided so as to cover the first lead-out wiring line W1 and the second lead-out wiring line W2, the second flattening layer 26 is provided on the first flattening layer 24, and the resin layer 25B provided at the same layer as that of the bank 25 is provided on the second flattening layer 26. Furthermore, in the bending region BA, the first flattening layer 24 where the plurality of relay wiring lines W3 are layered at a surface thereof is provided.

In the base coat layer (second insulating layer) 14 provided at the lower layer of the first lead-out wiring line W1 and the second lead-out wiring line W2, the opening HB is formed in a region overlapping the bending region BA. In the gate insulating layer (second insulating layer) 21 provided at the lower layer of the first lead-out wiring line W1 and the second lead-out wiring line W2, the opening HC is formed in the region overlapping the bending region BA. The opening HD is formed in the region overlapping the bending region BA in the first inorganic insulating layer (second insulating layer) 22 provided at the lower layer of the first lead-out wiring line W1 and the second lead-out wiring line W2. In the second inorganic insulating layer (second insulating layer) 23 provided at the lower layer of the first lead-out wiring line W1 and the second lead-out wiring line W2, the opening HE is formed in the region overlapping the bending region BA.

In the bending region BA, the first flattening layer 24 is provided in a region surrounded by the surface of the second base resin layer 13 exposed in the bending region BA, the opening HB formed in the base coat layer 14, the opening HC formed in the gate insulating layer 21, the opening HD formed in the first inorganic insulating layer 22, and the opening HE formed in the second inorganic insulating layer 23. The first flattening layer 24 in the bending region BA continuously extends in the X direction so as to connect both the end portions EB1 and EB2 to each other. The relay wiring line W3 extending in the Y direction is provided on the first flattening layer 24 in the bending region BA.

Note that the first flattening layer 24 provided in the bending region BA and the first flattening layer 24 provided in the display region DA are separated without being connected.

The second flattening layer 26 is provided on the first flattening layer 24 so as to cover the relay wiring line W3 provided at the same layer as that of the intermediate electrode M4. Note that the second flattening layer 26 provided in the display region DA does not need to be connected to the second flattening layer 26 provided near the bending region BA.

The resin layer 25B is, for example, at the same layer as that of the bank 25 in the display region DA, and is provided so as to be separated from the bank 25. Note that the resin layer 25B in the bending region BA may be omitted.

Figure 12:
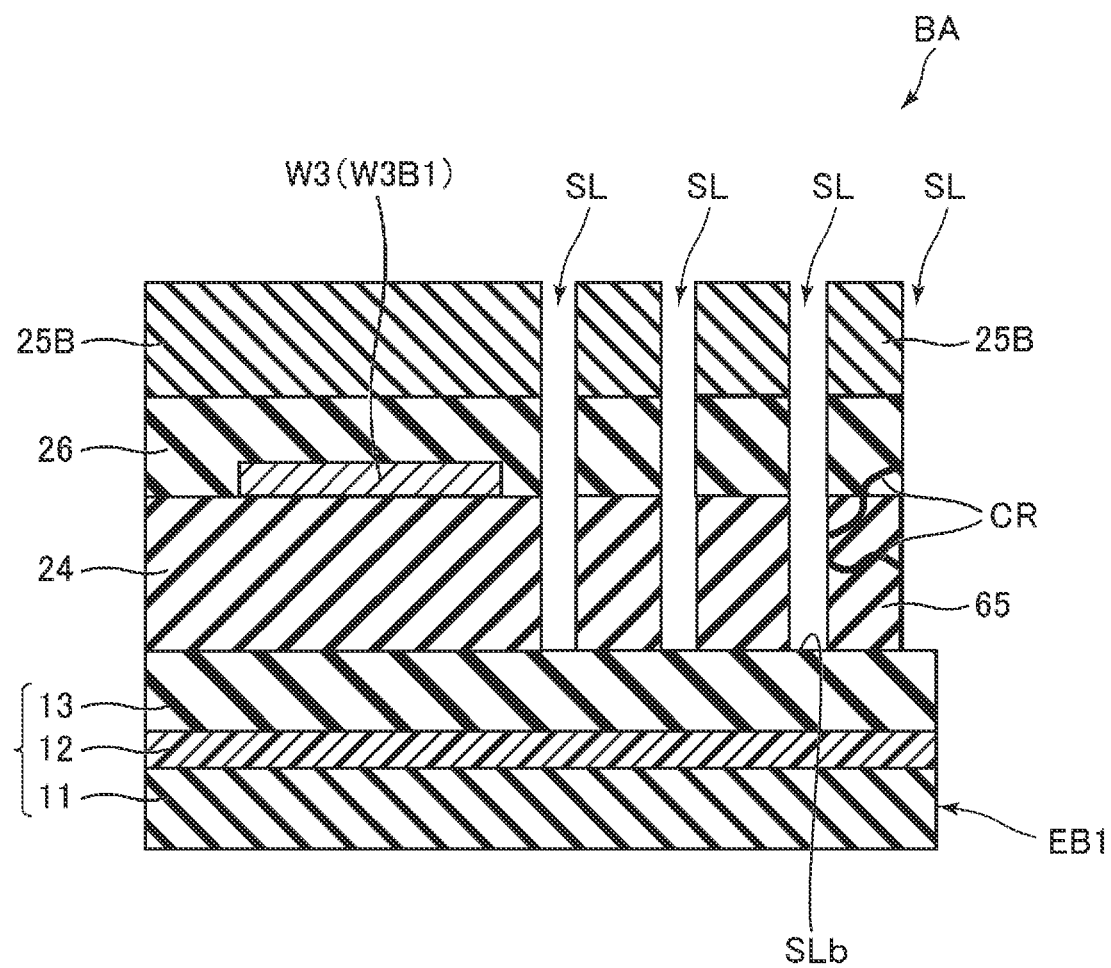
FIG. 12 is a cross-sectional view obtained by taking the lead-out wiring line at the one end in the bending region according to the second embodiment in an X direction.

FIG. 12 is a cross-sectional view obtained by taking the lead-out wiring line 61B1 at one end in the bending region according to the second embodiment along the X direction.

As illustrated in FIG. 11 and FIG. 12, in the display panel 2 according to the present embodiment, the first flattening layer 24 (first resin layer) and the second flattening layer 26 (second resin layer) in the bending region BA are formed with the plurality of slits SL having a depth from a surface of the second flattening layer 26 (the second resin layer) to the first flattening layer 24 (the first resin layer) at outer sides than the relay wiring lines W3B1 and W3B2 positioned at the both ends among the plurality of relay wiring lines W3 in a plan view.

With this, when the display panel 2 is cut into a desired size in the singulation step, even in a case where cracks CR are generated in the directions from the end portions EB1 and EB2 toward the inner sides of each of the first flattening layer 24 and the second flattening layer 26 in the bending region BA, generation of the cracks CR toward the further inner sides than the plurality of slits SL can be suppressed in the bending region BA. This makes it possible to suppress disconnection of the plurality of relay wiring lines W3 by the cracks CR.

Additionally, in the present embodiment, at least one of the plurality of slits SL preferably penetrates through the first flattening layer 24 in the Y direction. In other words, the plurality of slits SL are formed so as to extend along the Y direction (that is, along the end portions EB1 and EB2), at least one of the plurality of slits SL preferably has the same length as the length in the Y direction of the first flattening layer 24 in the bending region BA. According to this, generation of cracks CR from the end portions EB1 and EB2 of the first flattening layer 24 in the bending region BA toward inner sides than the first flattening layer 24 in the bending region BA can be more reliably suppressed by at least one of the plurality of slits SL. Thus, disconnection of the plurality of relay wiring lines W3 due to the cracks CR can more reliably be suppressed.

Note that all of the plurality of slits SL preferably penetrate through the first flattening layer 24 in the bending region BA in the Y direction.

Additionally, in the present embodiment, at least one of the plurality of slits SL preferably has a depth extending through the second flattening layer 26 (second resin layer) and the first flattening layer 24 (first resin layer). In other words, in the bending region BA, at least one bottom surface SLb of the plurality of slits SL is preferably a surface of the second base resin layer 13. This can more reliably suppress that cracks CR are generated toward the inner sides of each of the second flattening layer 26 and the first flattening layer 24 from the end portions EB1 and EB2 of each of the second flattening layer 26 and the first flattening layer 24 in the bending region BA by at least one of the plurality of slits SL. Thus, disconnection of the plurality of relay wiring lines W3 due to the cracks CR can more reliably be suppressed.

Additionally, at least one of the plurality of slits SL preferably has a depth extending through the resin layer 25B in addition to the second flattening layer 26 and the first flattening layer 24. This can more reliably suppress that the cracks CR generated from the end portions EB1 and EB2 are generated toward the further inner sides, and can suppress disconnection of the plurality of relay wiring lines W3.

Note that all of the plurality of slits SL preferably have a depth extending through the first flattening layer 24 and the filling layer 65.

Figure 13:
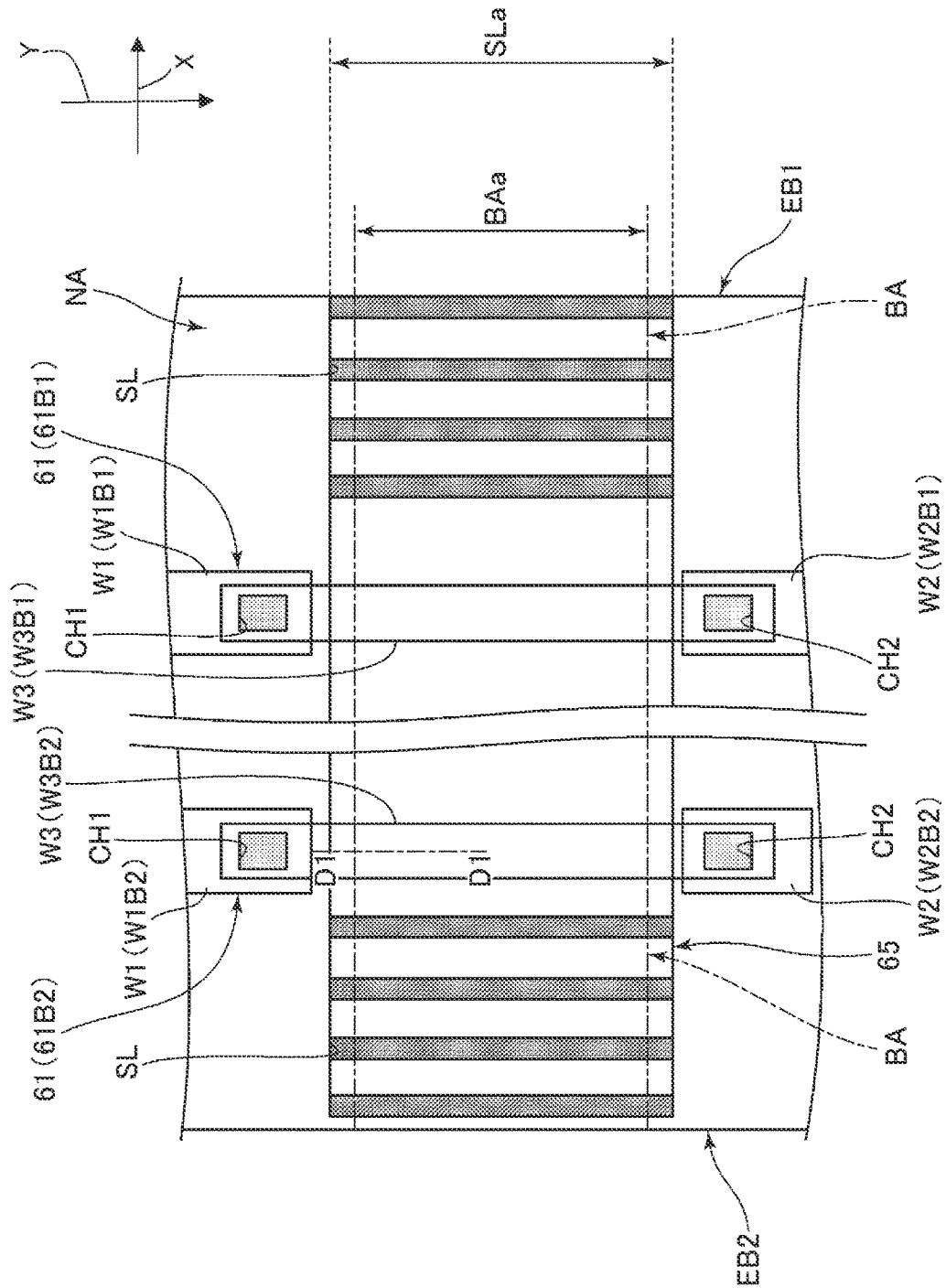
FIG. 13 is a plan view illustrating a schematic configuration near both end portions of a bending region of a display panel according to a modified example of the second embodiment.
Figure 14:
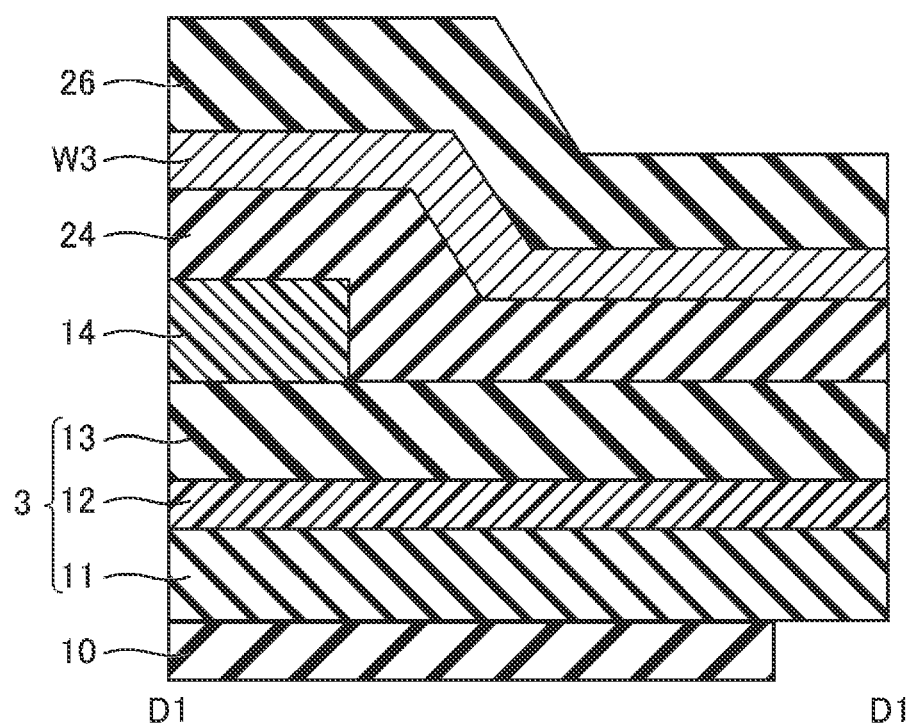
FIG. 14 is a cross-sectional view of the bending region according to the modified example of the second embodiment.
Figure 15:
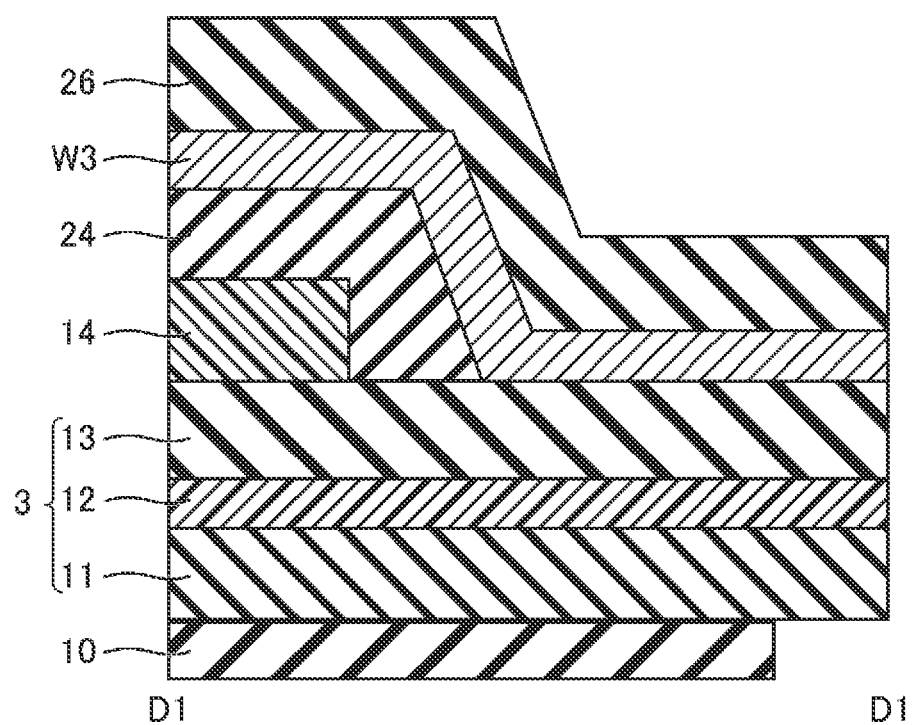
FIG. 15 is a cross-sectional view of a bending region according to another modified example of the second embodiment.

FIG. 13 is a plan view illustrating a schematic configuration near both the end portions EB1 and EB2 in the bending region BA of the display panel 2 according to a modified example of the second embodiment. FIG. 14 is a cross-sectional view of the bending region BA according to the modified example of the second embodiment. FIG. 15 is a cross-sectional view of the bending region BA according to another modified example of the second embodiment. FIG. 14 and FIG. 15 illustrate cross sections taken along a D1-D1 line illustrated in FIG. 13.

As illustrated in FIG. 13 to FIG. 15, the second flattening film 26 provided in the bending region BA may have a thin film thickness.

In the example illustrated in FIG. 14, the film thickness of the second flattening film 26 in the bending region BA is substantially the same as the film thickness of the first flattening film 24 provided on the base coat layer 14 near the bending region BA.

In the example illustrated in FIG. 15, the first flattening film 24 in the bending region BA is provided to be large enough to cover the end portion of the base coat layer 14 in the bending region BA. In addition, the first flattening film 24 is not formed at the central portion of the bending region BA, and the relay wiring line W3 is provided on the surface of the second base resin layer 13.

As illustrated in FIG. 13 to FIG. 15, the film thickness of the resin layer (for example, the second flattening layer 26) in the bending region BA is made to be as thin as possible, an increase in load applied on each layer constituting the bending region BA can be suppressed when the bending region BA is bent. As a result, the bending region BA can be easily bent.

The elements described in the above-described embodiments and the modified examples may be appropriately combined in a range in which a contradiction does not arise.

The invention claimed is:

1. A display device comprising:
   a display region of an image;
   a terminal region provided with a plurality of terminals; and
   a bending region being a region between the display region and the terminal region and being bendable,
   wherein the bending region includes
   a first resin layer,
   a plurality of relay wiring lines provided on the first resin layer and provided between the display region and the terminal region, and
   a second resin layer provided on the first resin layer and covering the plurality of relay wiring lines, and
   the first resin layer and the second resin layer in the bending region are formed with a plurality of slits having a depth from a surface of the second resin layer to the first resin layer at outer sides than the relay wiring lines provided at both ends among the plurality of relay wiring lines in a plan view.

2. The display device according to claim 1,
   wherein when a direction from the display region to the terminal region is defined as a first direction, at least one of the plurality of slits penetrates through the first resin layer in the first direction.

3. The display device according to claim 1,
   wherein at least one of the plurality of slits has a depth extending through the second resin layer and the first resin layer.

4. The display device according to claim 1,
   wherein both end portions at outer sides than the relay wiring lines provided at the both ends in the bending region overlap the slits provided at both ends among the plurality of slits.

5. The display device according to claim 1,
   wherein in the first resin layer in the bending region, a thickness at outer sides than the relay wiring lines provided at both ends among the plurality of relay wiring lines is thinner than a thickness of a region surrounded by the relay wiring lines provided at the both ends.

6. The display device according to claim 1,
   wherein in the second resin layer in the bending region, a thickness at outer sides than the relay wiring lines provided at both ends among the plurality of relay wiring lines is thinner than a thickness of a region surrounded by the relay wiring lines provided at the both ends.

7. The display device according to claim 1, further comprising:
   a plurality of first lead-out wiring lines extending from the display region in a direction of the bending region;
   a plurality of second lead-out wiring lines extending in the direction of the bending region, respectively from the plurality of terminals; and
   a first insulating layer covering the plurality of first lead-out wiring lines and the plurality of second lead-out wiring lines,
   wherein, in each of the plurality of relay wiring lines,
   one end portion is electrically connected to the corresponding first lead-out wiring line among the plurality of first lead-out wiring lines through a corresponding first contact hole among a plurality of the first contact holes formed in the first insulating layer, and the other end portion is electrically connected to the corresponding second lead-out wiring line among the plurality of second lead-out wiring lines through a corresponding second contact hole among a plurality of the second contact holes formed in the first insulating layer.

8. The display device according to claim 7, further comprising:
a second insulating layer provided at a lower layer of the plurality of first lead-out wiring lines and the plurality of second lead-out wiring lines,
wherein, in the bending region, the second insulating layer includes an opening extending in a direction intersecting the plurality of relay wiring lines.

9. The display device according to claim 7,
wherein the display region includes
a plurality of thin film transistors each of which includes a gate electrode, and a source electrode and a drain electrode that are provided at a layer different from a layer of the gate electrode,
the plurality of first lead-out wiring lines and the plurality of second lead-out wiring lines are provided at a layer identical to a layer of a plurality of the gate electrodes, and
the plurality of relay wiring lines are provided at a layer identical to a layer of a plurality of the source electrodes and a plurality of the drain electrodes.

10. The display device according to claim 7,
wherein the display region includes
a plurality of thin film transistors each including a gate electrode, and a source electrode and a drain electrode that are provided at a layer different from a layer of the gate electrode,
a first flattening layer covering the plurality of thin film transistors and including a resin material,
an intermediate electrode provided in an island shape on the first flattening layer and configured to be electrically connected to the drain electrode through a contact hole formed in the first flattening layer, a second flattening layer covering the intermediate electrode, provided on the first flattening layer, and including a resin material, and
an anode electrode or a cathode electrode provided in an island shape on the second flattening layer,
the plurality of first lead-out wiring lines and the plurality of second lead-out wiring lines are provided at a layer identical to a layer of a plurality of the source electrodes and a plurality of the drain electrodes, and
the plurality of relay wiring lines are provided at a layer identical to a layer of the intermediate electrode.

11. A manufacturing method of a display device including
a display region of an image,
a terminal region provided with a plurality of terminals, and
a bending region being a region between the display region and the terminal region and being bendable,
the manufacturing method comprising:
forming the bending region,
wherein the forming of the bending region includes
forming a first resin layer,
forming a plurality of relay wiring lines between the display region and the terminal region on the first resin layer, and
forming a second resin layer covering the plurality of relay wiring lines on the first resin layer, and
forming a plurality of slits having a depth from a surface of the second resin layer to the first resin layer in the first resin layer and the second resin layer at outer sides than the relay wiring lines provided at both ends among the plurality of relay wiring lines in a plan view.

12. The manufacturing method of the display device according to claim 11, further comprising:
cutting the first resin layer and the second resin layer in a manner that an outer edge portion of the plurality of slits is included, after the forming the plurality of slits, and singulating a display panel including the display region, the bending region, and the terminal region; and
bending the bending region in the display panel after the singulating.

* * * * *